(12) United States Patent
Tada et al.

(10) Patent No.: US 7,286,027 B2
(45) Date of Patent: Oct. 23, 2007

(54) MICRORESONATOR, MANUFACTURING METHOD, AND ELECTRONIC APPARATUS

(75) Inventors: Masahiro Tada, Kanagawa (JP);
Masahiro Tanaka, Kanagawa (JP);
Shun Mitarai, Kanagawa (JP); Koji Naniwada, Tokyo (JP)

(73) Assignee: Sony Corporation, Tokyo (JP)

( * ) Notice: Subject to any disclaimer, the term of this patent is extended or adjusted under 35 U.S.C. 154(b) by 218 days.

(21) Appl. No.: 11/264,344

(22) Filed: Oct. 4, 2005

(65) Prior Publication Data
US 2006/0103491 A1    May 18, 2006

(30) Foreign Application Priority Data
Oct. 7, 2004   (JP) ............................ P2004-294891

(51) Int. Cl.
  *H03H 9/24*   (2006.01)
  *H03H 9/46*   (2006.01)
  *H03H 3/007*  (2006.01)
(52) U.S. Cl. ...................... 333/186; 333/187; 333/189; 438/50; 438/53

(58) Field of Classification Search ................ 333/186, 333/187, 189
See application file for complete search history.

(56) References Cited

U.S. PATENT DOCUMENTS

| | | | |
|---|---|---|---|
| 5,698,928 A * | 12/1997 | Mang et al. ................. | 310/322 |
| 6,486,751 B1 * | 11/2002 | Barber et al. ............... | 333/187 |
| 6,828,877 B2 * | 12/2004 | Nakanishi et al. .......... | 333/186 |
| 7,227,432 B2 * | 6/2007 | Lutz et al. .................. | 333/186 |
| 2003/0222732 A1 * | 12/2003 | Matthaei .................... | 333/99 S |

* cited by examiner

*Primary Examiner*—Barbara Summons
(74) *Attorney, Agent, or Firm*—Sonnenschein Nath & Rosenthal LLP

(57) ABSTRACT

The present invention provides a microresonator including a plurality of resonator elements arranged on a plurality of columns on a substrate. The resonator elements each have an input electrode, an output electrode, and a diaphragm that extends in a certain direction, and each pass a signal of a certain frequency. The plurality of resonator elements includes a plurality of first resonator elements arranged on first columns that are located on every other column of the plurality of columns, and having a first phase, and a plurality of second resonator elements arranged on second columns that are located on every other column, other than the first columns, of the plurality of columns, and having a second phase that is an opposite phase of the first phase.

12 Claims, 22 Drawing Sheets

FIG.7
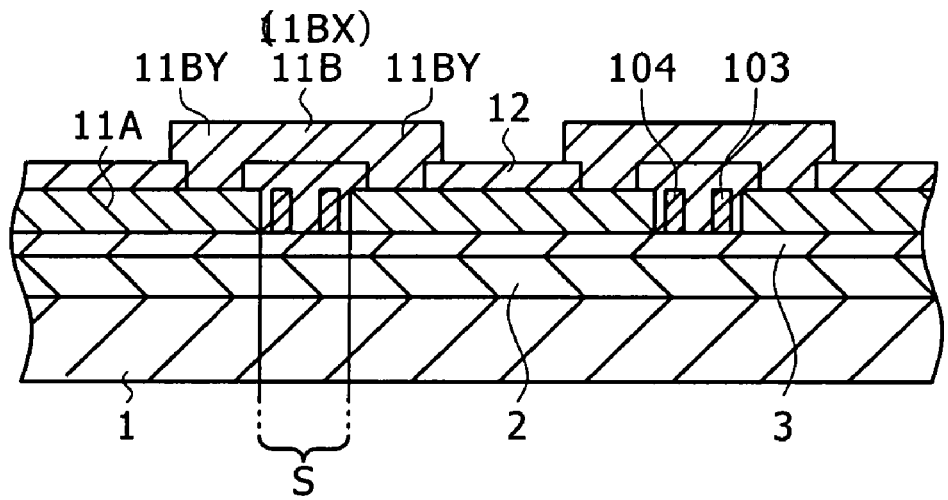
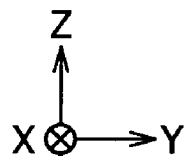
FIG.8
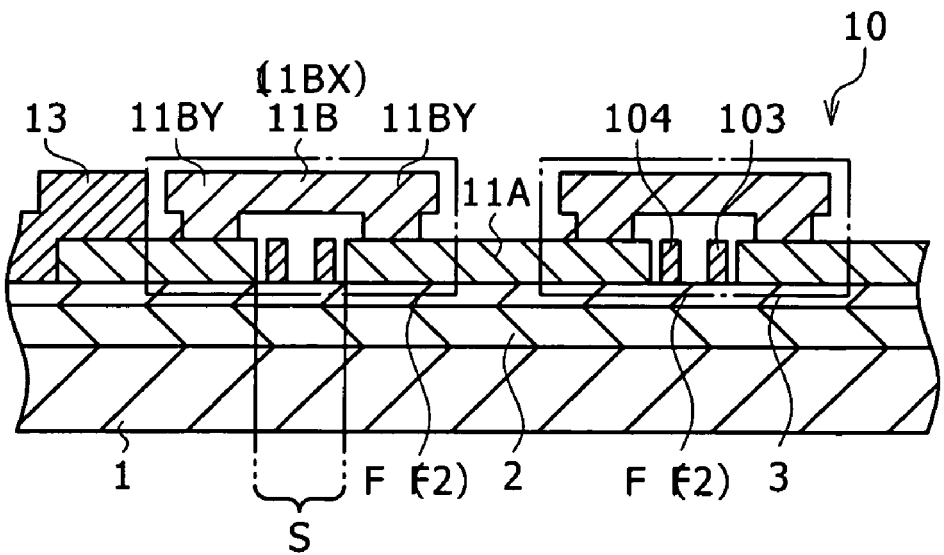
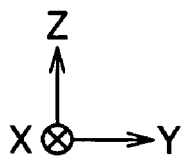

FIG. 9
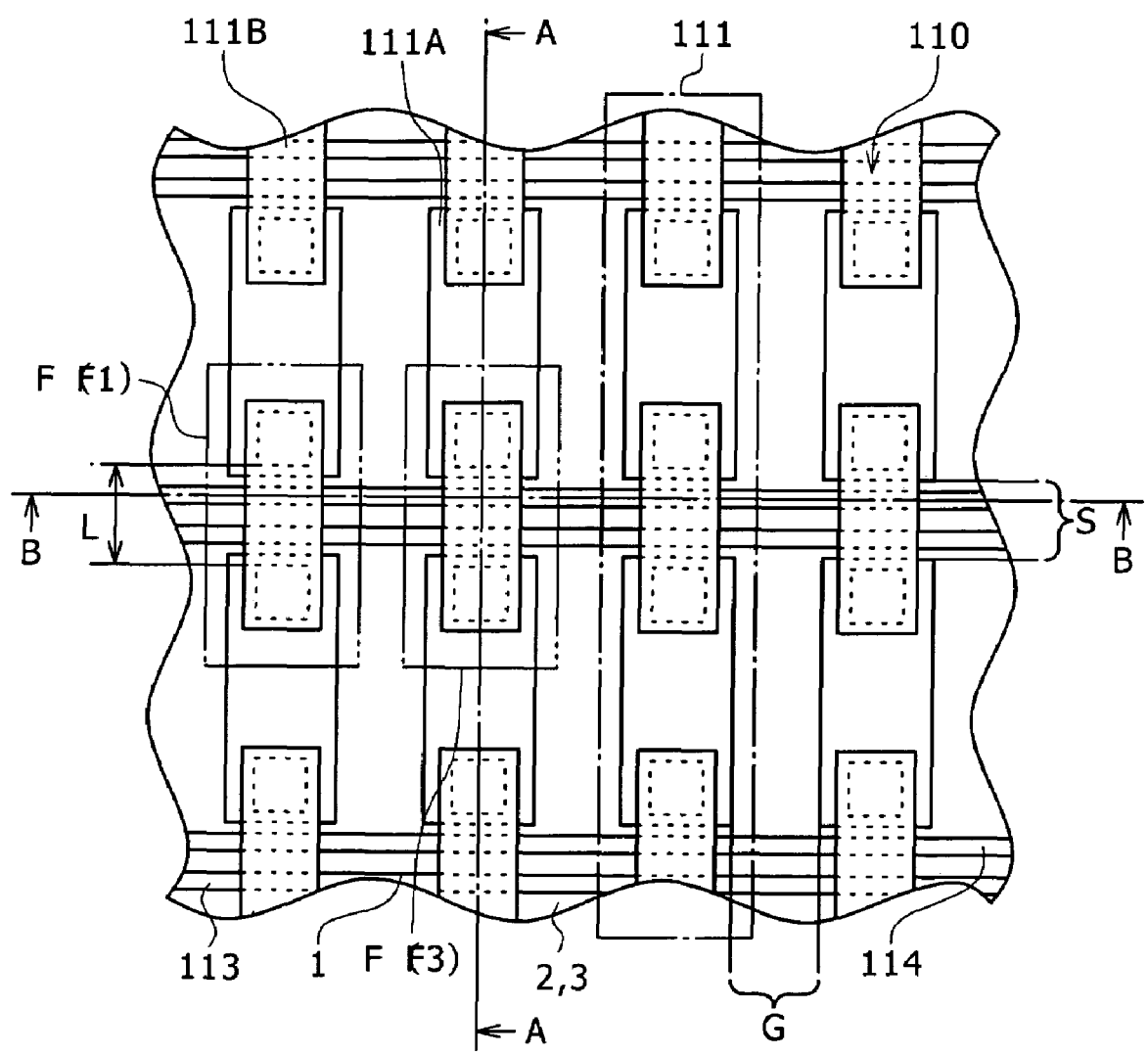
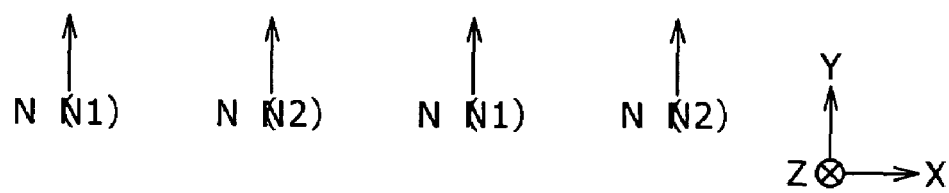

FIG. 22
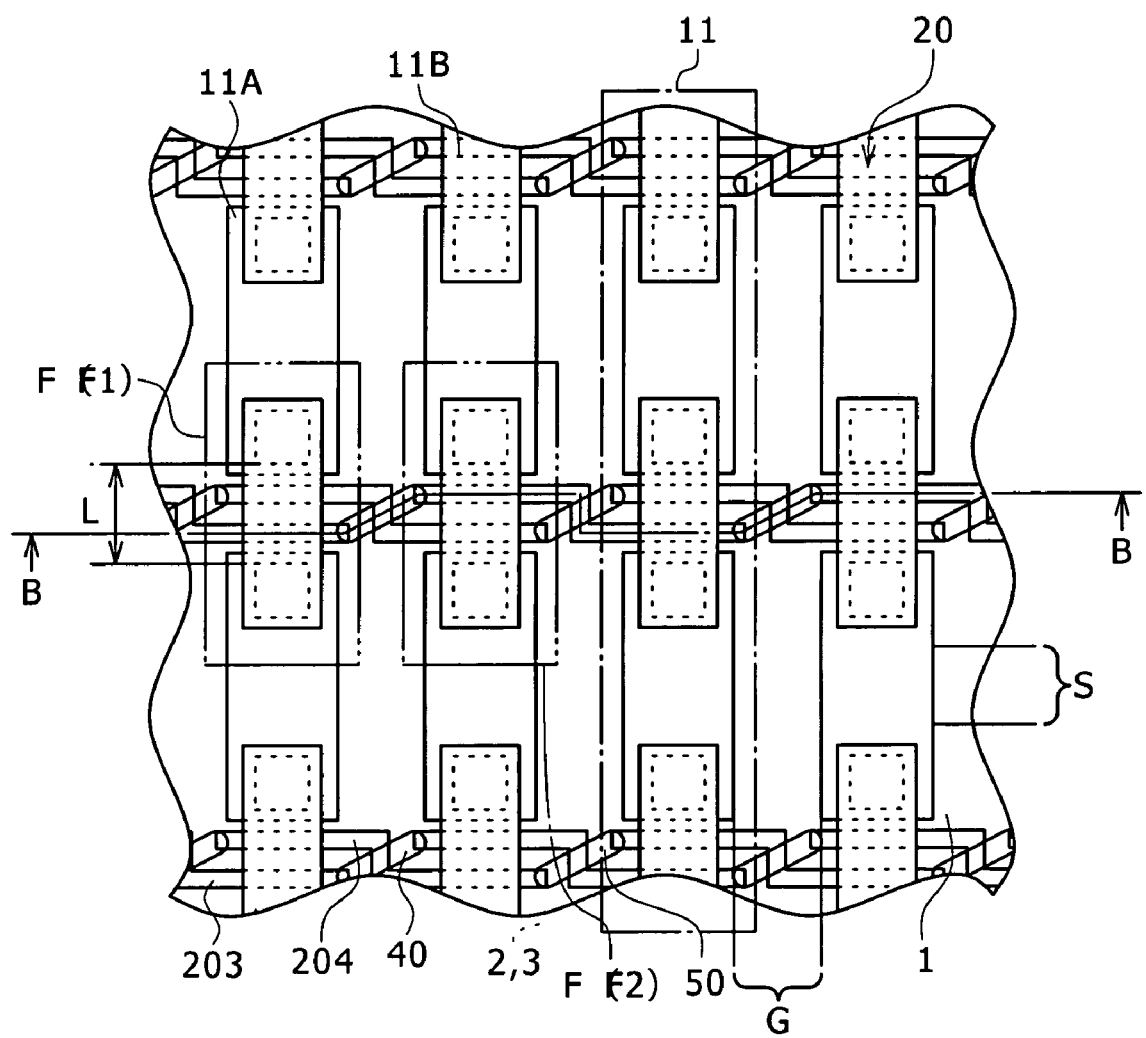
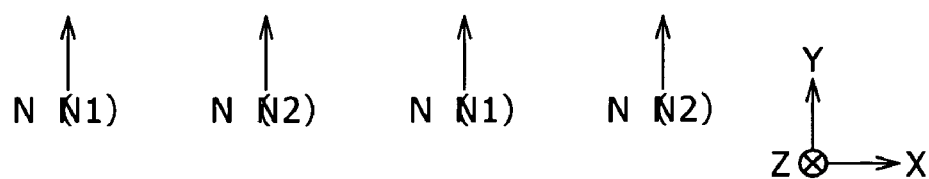

FIG.27
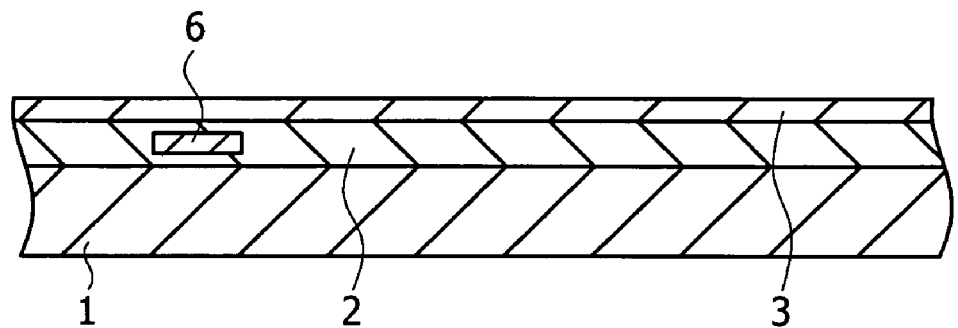
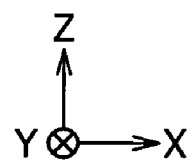
FIG.28
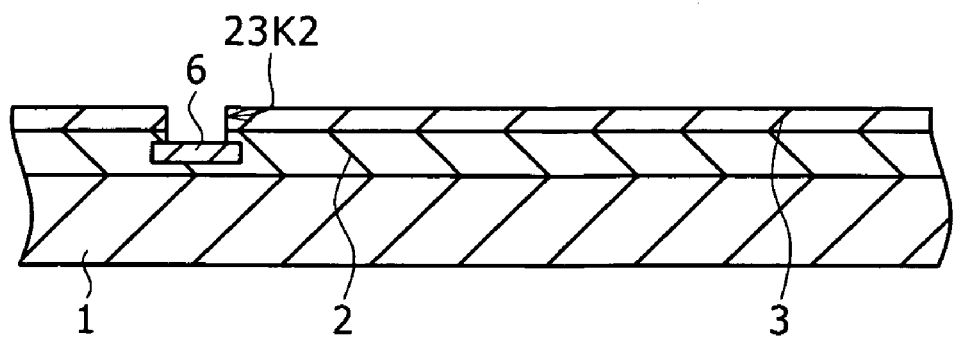
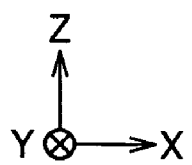

FIG. 29
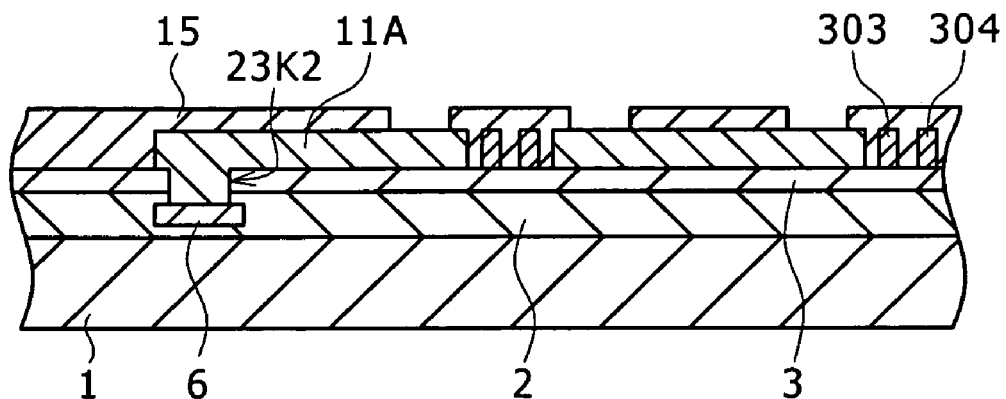
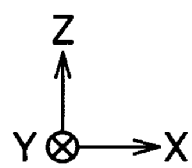
FIG. 30
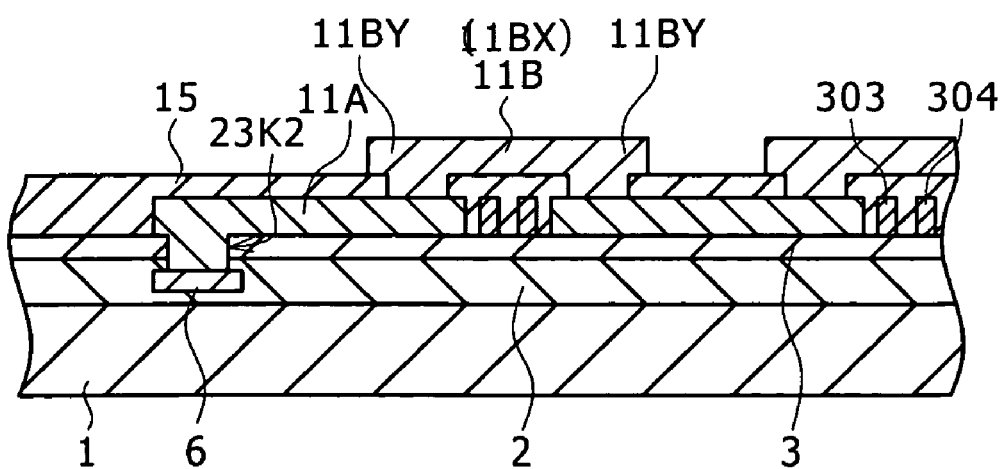
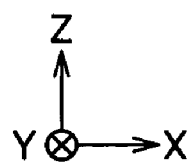

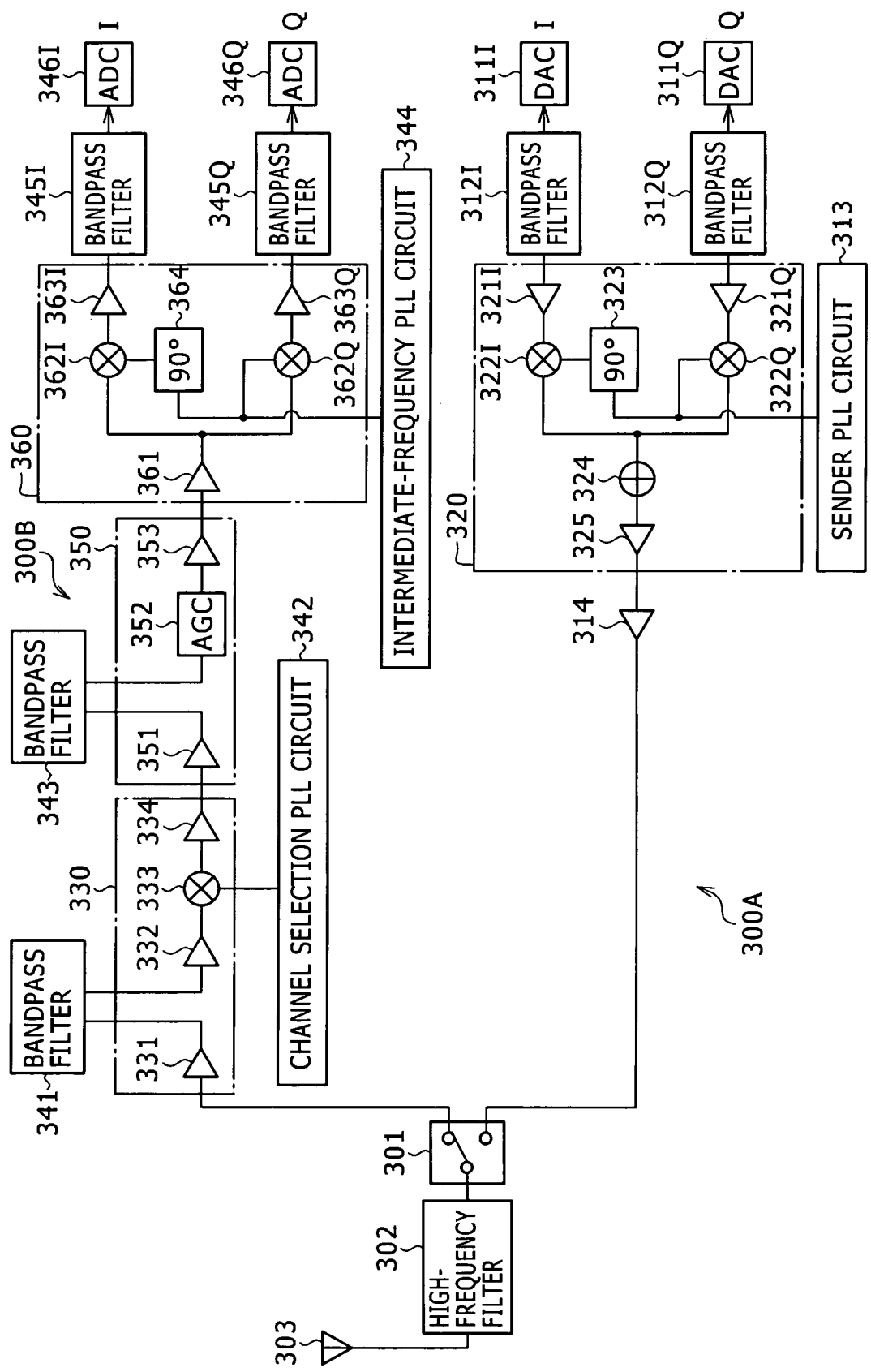
F I G. 3 3

MICRORESONATOR, MANUFACTURING METHOD, AND ELECTRONIC APPARATUS

CROSS REFERENCES TO RELATED APPLICATIONS

The present invention contains subject matter related to Japanese Patent Application JP 2004-294891 filed in the Japanese Patent Office on Oct. 7, 2004, the entire contents of which being incorporated herein by reference.

BACKGROUND OF THE INVENTION

The present invention relates to a microresonator applied to a high-frequency filter for example, a manufacturing method thereof, and an electronic apparatus including a microresonator, typified by a communication device such as a cellular phone.

In recent years, micro resonator elements formed by using semiconductor processes have been known. An example of the resonator elements is disclosed in "High-QVHF micromechanical contour-mode disk resonators", J. R. Clark, W. -T. Hsu, and C. T. -C. Nguyen, Technical Digest, IEEE Int. Electron Devices Meeting, San Francisco, Calif., Dec. 11-13, 2000, pp. 399-402, for example. The resonator elements have three features: small occupation area, potential for a high Q-value, and capability of integration with other semiconductor devices. It therefore has been studied to apply the resonator elements to a high-frequency filter included in an electronic apparatus such as a cellular phone used in a wireless communication filed. Note that the "Q-value" indicates the performance of a resonant circuit.

SUMMARY OF THE INVENTION

When applying the resonator elements to a high-frequency filter, since only a single element has a too large impedance and therefore cannot be put into practical use, an assembly structure (microresonator) needs to be formed by two-dimensionally arranging a plurality of resonator elements in order to adequately reduce the impedance.

When applying the microresonator to a high-frequency filter, in order to ensure a desired frequency characteristic (that is, resonance characteristic) of the microresonator, the influence of mutual interference arising among the resonator elements needs to be suppressed. However, microresonators in related art cannot sufficiently suppress the influence of mutual interference among the resonator elements due to the structural factors thereof, and therefore involve difficulties of ensuring a desired frequency characteristic. The reason therefor is as follows.

Specifically, the size of formed resonator elements is apt to have variation since high formation accuracy is required for forming the resonator elements. Therefore, a microresonator has a tendency in that there is variation in the central frequency among the resonator elements. In order to suppress the variation in the central frequency, it is conceivable that the length of an essential part (vibration part) of the resonator element is designed to be larger so that the formation accuracy of the resonator element may permit a margin of error, to thereby suppress the variation in the size of the formed resonator elements. However, if the length of the vibration part of the resonator element is larger, the thickness of the vibration part also needs to be larger in order to enhance the central frequency. However, if the thickness of the vibration part is larger than about 1 µm, the influence of mutual interference arising among the resonator elements is large, which easily causes the deterioration of the frequency characteristic. Therefore, in order to ensure a desired frequency characteristic of the microresonator applied to a high-frequency filter, a need arises to establish a technique capable of suppressing the influence of mutual interference arising among the resonator elements. In addition, it is also essential to establish a technique allowing easy manufacturing of the microresonator in consideration of mass-productivity of the microresonators in particular.

It is desirable to provide a microresonator that can ensure a desired frequency characteristic thereof by suppressing the influence of mutual interference arising among resonator elements.

It is also desirable to provide a method of manufacturing a microresonator for allowing easy manufacturing of a microresonator ensuring a desired frequency characteristic thereof.

In addition, it is desirable to provide an electronic apparatus that includes a microresonator and thus can ensure a desired frequency characteristic.

According to an embodiment of the present invention, a microresonator includes a plurality of resonator elements arranged on a plurality of columns on a substrate. The resonator elements each have an input electrode, an output electrode, and a diaphragm that extends in a certain direction, and each pass a signal of a certain frequency. The plurality of resonator elements includes a plurality of first resonator elements arranged on first columns that are located on every other column of the plurality of columns, and having a first phase, and a plurality of second resonator elements arranged on second columns that are located on every other column, other than the first columns, of the plurality of columns, and having a second phase that is an opposite phase of the first phase.

In the microresonator according to the embodiment of the present invention, the plurality of resonator elements are formed so that the plurality of first resonator elements arranged on the first columns have the first phase, while the plurality of second resonator elements arranged on the second columns have the second phase that is the opposite phase of the first phase. Thus, the influence of mutual interference arising among the resonator elements is suppressed and therefore the frequency characteristic is less susceptible to deterioration due to the influence of the mutual interference.

According to an embodiment of the present invention, a method of manufacturing a microresonator includes a plurality of resonator elements arranged on a plurality of columns on a substrate. The resonator elements each have an input electrode, an output electrode, and a diaphragm that extends in a certain direction, and each pass a signal of a certain frequency. The method includes a step of forming the plurality of resonator elements. The step includes steps of forming a plurality of first resonator elements constituting one part of the plurality of resonator elements so that the first resonator elements are arranged on first columns located on every other column of the plurality of columns, and have a first phase, and forming a plurality of second resonator elements constituting the other part of the plurality of resonator elements so that the second resonator elements are arranged on second columns located on every other column, other than the first columns, of the plurality of columns, and have a second phase that is an opposite phase of the first phase.

The method of manufacturing a microresonator according to the embodiment of the present invention does not employ novel and complicated manufacturing processes but employs only existing thin-film processes, to form a microresonator in which, of the plurality of resonator elements, the plurality of first resonator elements arranged on the first columns have the first phase, while the plurality of second resonator elements arranged on the second columns have the second phase that is the opposite phase of the first phase.

According to an embodiment of the present invention, an electronic apparatus includes a microresonator that has a plurality of resonator elements arranged on a plurality of columns on a substrate. The resonator elements each have an input electrode, an output electrode, and a diaphragm that extends in a certain direction, and each pass a signal of a certain frequency. The plurality of resonator elements includes a plurality of first resonator elements arranged on first columns that are located on every other column of the plurality of columns, and having a first phase, and a plurality of second resonator elements arranged on second columns that are located on every other column, other than the first columns, of the plurality of columns, and having a second phase that is an opposite phase of the first phase.

The electronic apparatus according to the embodiment of the present invention includes the microresonator having the above-described structural characteristics. Therefore, the frequency characteristic of the microresonator is less susceptible to deterioration due to the influence of mutual interference arising among the resonator elements.

According to the microresonator of the embodiment of the present invention, the frequency characteristic is less susceptible to deterioration due to the influence of mutual interference arising among the resonator elements based on a structural characteristic in that, of the plurality of resonator elements, the plurality of first resonator elements arranged on the first columns have the first phase, while the plurality of second resonator elements arranged on the second columns have the second phase that is the opposite phase of the first phase. Thus, a desired frequency characteristic can be ensured.

According to the method of manufacturing a microresonator of the embodiment of the present invention, novel and complicated manufacturing processes are not used based on a characteristic of the manufacturing method in that only existing thin-film processes are used to form a microresonator in which, of the plurality of resonator elements, the plurality of first resonator elements arranged on the first columns have the first phase, while the plurality of second resonator elements arranged on the second columns have the second phase that is the opposite phase of the first phase. Thus, by using only existing thin-film processes, a microresonator ensuring a desired frequency characteristic can easily be manufactured.

According to the electronic apparatus of the embodiment of the present invention, the frequency characteristic is less susceptible to deterioration due to the influence of mutual interference arising among the resonator elements based on a structural characteristic of including the microresonator having the above-described structural characteristics. Therefore, a desired frequency characteristic can be ensured due to the microresonator.

BRIEF DESCRIPTION OF THE DRAWINGS

These and other objects of the invention will be seen by reference to the description, taken in connection with the accompanying drawings, in which:

FIG. 7 is a sectional view explaining a step subsequent to the step of FIG. 6;

FIG. 8 is a sectional view explaining a step subsequent to the step of FIG. 7;

FIG. 9 is a plan view illustrating the planar structure (planar structure along the XY-plane) of a microresonator of a first comparative example against the microresonator according to the first embodiment of the invention;

FIG. 22 is a plan view illustrating the planar structure (planar structure along the XY-plane) of a modification of the resonant circuit of the microresonator according to the second embodiment of the invention;

FIG. 27 is a sectional view explaining a manufacturing step of the microresonator according to the third embodiment of the invention;

FIG. 28 is a sectional view explaining a step subsequent to the step of FIG. 27;

FIG. 29 is a sectional view explaining a step subsequent to the step of FIG. 28;

FIG. 30 is a sectional view explaining a step subsequent to the step of FIG. 29;

FIG. 33 is a block diagram illustrating the block configuration of an electronic apparatus (communication device) including the microresonator according to any of the embodiments of the invention.

DETAILED DESCRIPTION OF THE PREFERRED EMBODIMENTS

Embodiments of the present invention will be described in detail below with reference to the accompanying drawings.

First Embodiment

Figure 1:
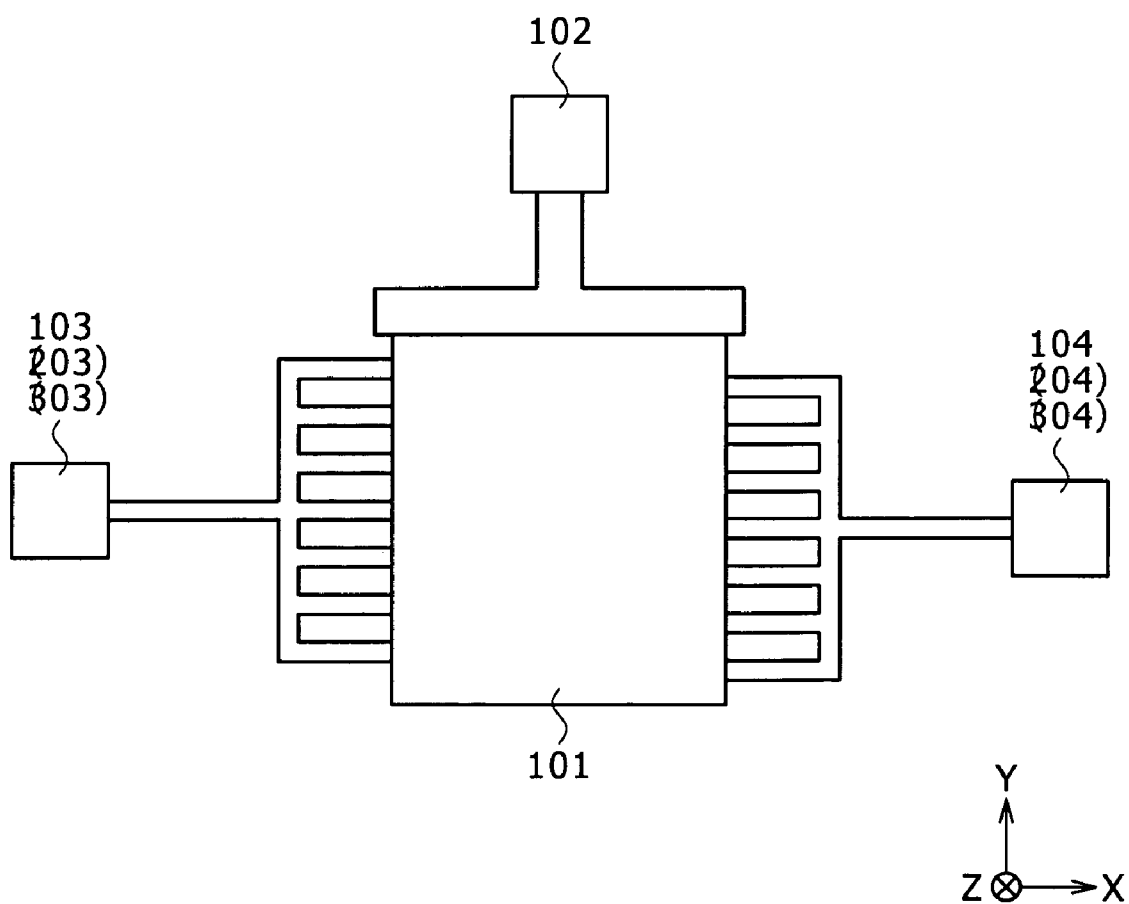
FIG. 1 is a plan view illustrating the planar structure (planar structure along the XY-plane) of a microresonator according to a first embodiment of the invention.

The structure of a microresonator according to a first embodiment of the invention will be described with reference to FIG. 1. FIG. 1 illustrates the planar structure (planar structure along the XY-plane) of the microresonator.

The microresonator according to the present embodiment is a microstructure (so-called micromachine) used for controlling frequencies for example. Specifically, the microresonator is applied, as a high-frequency filter having a mechanism for controlling frequencies, to an electronic apparatus typified by a communication device such as a cellular phone used in a wireless communication field. Referring to FIG. 1, the microresonator includes a resonant circuit 101 that is an essential part implementing resonant operation, and three electrodes provided for the resonant circuit 101: a DC applying electrode 102 for applying direct current voltages; an input electrode 103 for inputting signals; and an output electrode 104 for outputting signals. Both the input electrode 103 and the output electrode 104 have a plurality of branched parts close to the resonant circuit 101 and a focusing part remote from the resonant circuit 101, for example. Note that the illustration of the resonant circuit 101 in FIG. 1 is schematic.

Figure 2:
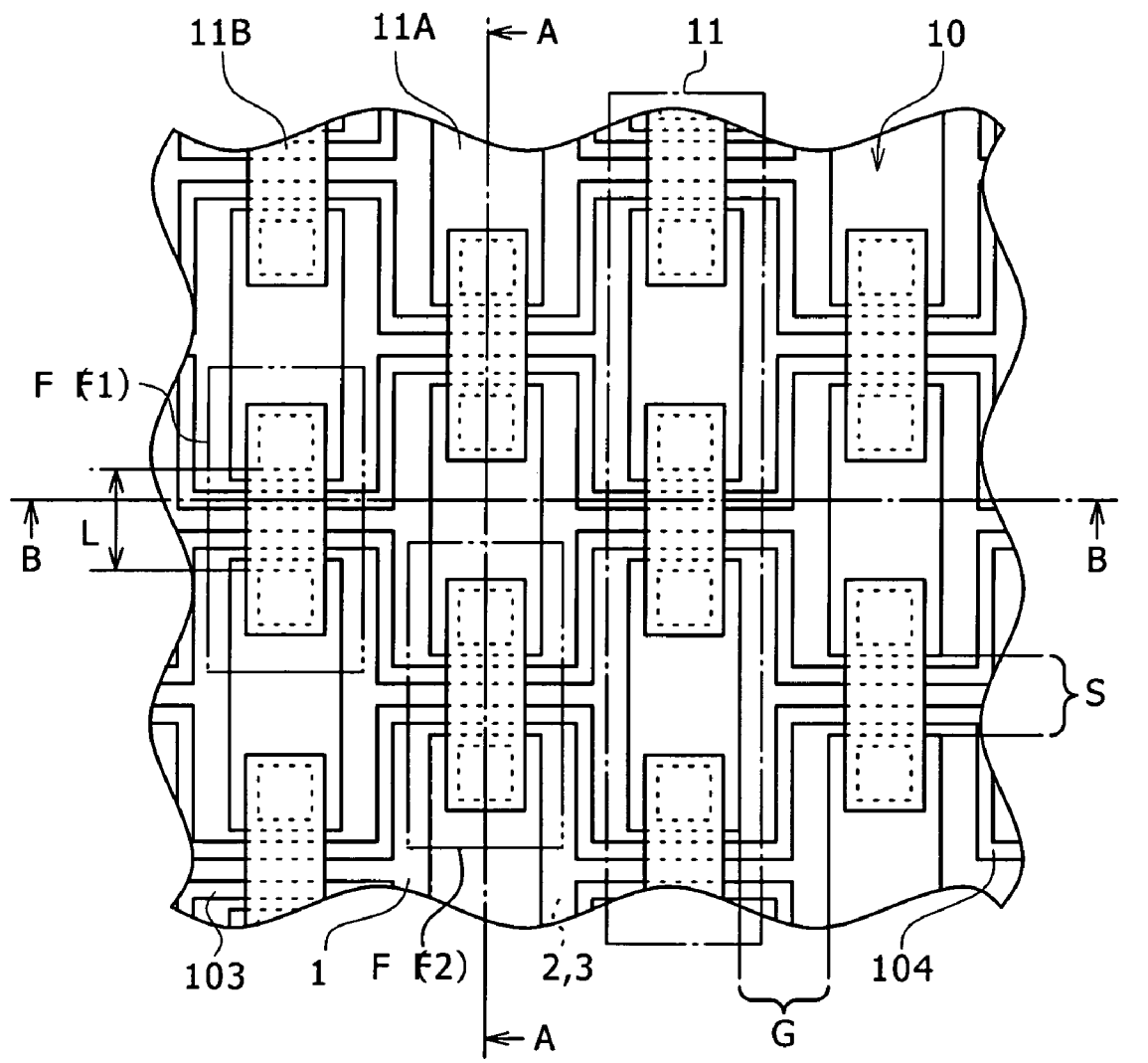
FIG. 2 is a plan view illustrating the planar structure (planar structure along the XY-plane) of a resonant circuit in a magnified form.
Figure 3:
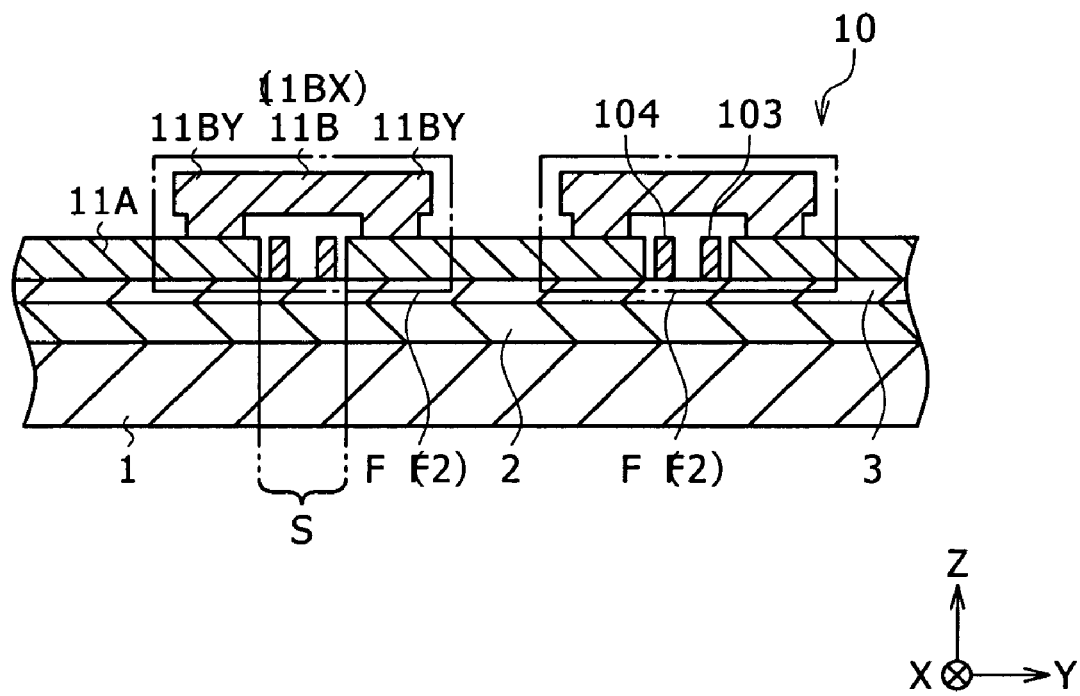
FIG. 3 is a sectional view illustrating the sectional structure of the resonant circuit along the line A-A of FIG. 2 (sectional structure along the YZ-plane)
Figure 4:
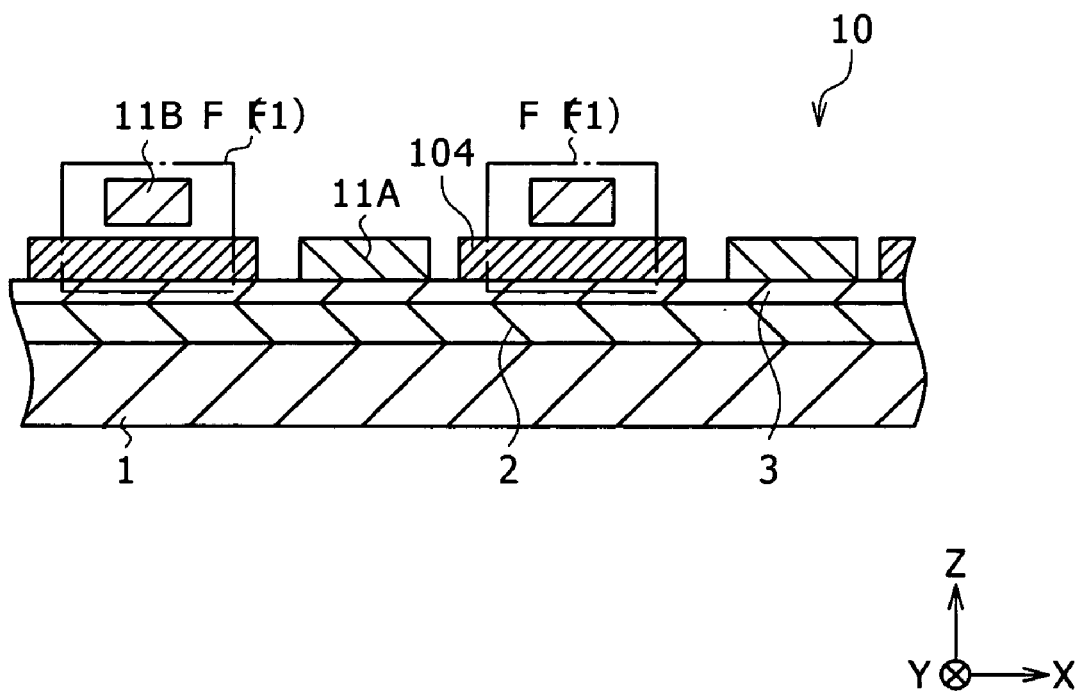
FIG. 4 is a sectional view illustrating the sectional structure of the resonant circuit along the line B-B of FIG. 2 (sectional structure along the XZ-plane)

The detailed structure of the microresonator will be described with reference to FIGS. 1 to 4. FIGS. 2 to 4 illustrate the structure of the resonant circuit 101 in a magnified form. FIG. 2 illustrates the planar structure (planar structure along the XY-plane). FIG. 3 illustrates the sectional structure along the line A-A of FIG. 2 (sectional structure along the YZ-plane). FIG. 4 illustrates the sectional structure along the line B-B of FIG. 2 (sectional structure along the XZ-plane).

Referring to FIGS. 2 to 4, the resonant circuit 101 has a structure in which insulating layers 2 and 3 and a microresonator 10 are deposited in that order over a substrate 1.

The substrate 1 mainly supports the microresonator structure 10, and is composed of silicon (Si) for example. Both the insulating layers 2 and 3 electrically isolate the microresonator structure 10 from the substrate 1. For example, the insulating layer 2 is composed of an insulating material such as silicon dioxide ($SiO_2$), and the insulating layer 3 is composed of an insulating material such as silicon nitride (SiN).

As shown in FIGS. 2 to 4, the microresonator structure 10 includes a plurality of micro resonator elements F formed by using semiconductor processes, and is an assembly structure in which the plurality of resonator elements F are two-dimensionally arranged to be capable of electrically resonating. The microresonator structure 10 includes a plurality of electrode portions 11 extending in the Y-axis direction with repeatedly constituting the plural resonator elements F. The plural electrode portions 11 are arranged on a plurality of columns N across the X-axis direction intersecting with the Y-axis direction. Specifically, the resonator element F has the input electrode 103, the output electrode 104, and a diaphragm that extends in a certain direction (the Y-axis direction) and can electrically vibrate. The resonator element F passes a signal of a certain frequency. Details of the "diaphragm" will be described later. The input electrode 103 and the output electrode 104 are incorporated in the microresonator structure 10. That is, the microresonator structure 10 has a structure (so-called three-port structure) including two kinds of signal electrodes (the input electrode 103 and the output electrode 104) as well as the DC applying electrode 102.

Referring to FIG. 2, the plural resonator elements F of the microresonator structure 10 are composed of a plurality of resonator elements F1 (first resonator elements) and a plurality of resonator elements F2 (second resonator elements). The resonator elements F1 are arranged on columns N1 (first columns) that are located on every other column of the plural columns N, and have a phase P1 (first phase). The resonator elements F2 are arranged on columns N2 (second columns) that are located on every other column, other than the columns N1, of the plural columns N, and have a phase P2 (second phase) that is the opposite phase of the phase P1. Specifically, in the microresonator structure 10, the input and output electrodes 103 and 104 are juxtaposed to each other in each resonator element F in a manner of extending in a direction (the X-axis direction) intersecting with the extension direction of the diaphragm (the Y-axis direction). The positional relationship between the juxtaposed input and output electrodes 103 and 104 on the columns N1 is opposite to that on the columns N2. The meaning of the expression "positional relationship is opposite" is more apparent when the positional relationship in the Y-axis direction between the input and output electrodes 103 and 104 on the columns N1 is compared with that on the columns N2 referring to FIG. 2. Specifically, in each resonator element F1 on the columns N1, the input and output electrodes 103 and 104 are located on the lower and upper sides of the drawing, respectively. In contrast, in each resonator element F2 on the columns N2, the input and output electrodes 103 and 104 are located on the upper and lower sides of the drawing, respectively.

In addition, as shown in FIG. 2, the positions of the plural resonator elements F1 are offset relative to those of the plural resonator elements F2 in the extension direction of the diaphragm (the Y-axis direction). Specifically, in the microresonator structure 10, the plural electrode portions 11 are juxtaposed to each other with gaps G thereamong so that the positions of the resonator elements F (F1 and F2) are offset relative to each other in the Y-axis direction between the adjacent electrode portions 11. The structures of the plural electrode portions 11 on the same line along the X-axis direction are identical to each other with respect to the positions of the resonator elements F1 and F2. That is, the plural electrode portions 11 are arranged so that the plural resonator elements F1 and F2 are staggered in relation to each other.

The electrode portions 11 are composed of a plurality of electrode patterns 11A and a plurality of electrode patterns 11B. The electrode patterns 11A are repeatedly disposed along the Y-axis direction with certain intervals S thereamong. The electrode patterns 11B are repeatedly disposed along the Y-axis direction in a manner of coupling the electrode patterns 11A to each other with ensuring the gaps S. The electrode patterns 11A and 11B constitute the plural resonator elements F. Both the electrode patterns 11A and 11B constituting the electrode portions 11 are composed of a semiconductor material such as poly silicon (poly-Si) including phosphorous (P) for example. The electrode pattern 11A has a rectangular planar structure as shown in FIG. 2, and a rectangular sectional structure as shown in FIGS. 3 and 4 for example. The electrode pattern 11B has a rectangular planar structure as shown in FIG. 2, and a beam-shaped sectional structure as shown in FIG. 3 for example. Specifically, the electrode pattern 11B has a bridge-shaped sectional structure in which one end thereof is coupled to one electrode pattern 11A of two adjacent electrode patterns 11A, and the other end to the other electrode pattern 11A. As shown in FIG. 3, the electrode pattern 11B includes a vibration part 11BX extending in a certain direction (the Y-axis direction) and two support columns 11BY that support the vibration part 11BX. Specifically, the vibration part 11BX is supported by two support columns 11BY provided for one and the other ends of the vibration part 11BX so that the vibration part 11BX can vibrate. The vibration part 11BX corresponds to the above-described "diaphragm" of the resonator element F.

Here, description will be made for confirmation referring back to FIG. 2. The term "electrode portions 11" refers to coupling structures that extend in the Y-axis direction and constitute the resonator elements F by coupling of the plural electrode patterns 11A with the plural electrode patterns 11B. In addition, the above description "the plural electrode portions 11 are arranged so that the plural resonator elements F1 and F2 are staggered in relation to each other" refers to such an arrangement relationship between the resonator elements F1 and F2 that the distance of the offset in the Y-axis direction between the resonator elements F1 and F2 has the maximum value.

As shown in FIG. 2, the input and output electrodes 103 and 104 are provided to extend along the electrode patterns 11A with passing through the intervals S and the gaps G. Specifically, the electrodes are disposed to bypass the electrode patterns 11A from the both sides of the electrode patterns 11A. The input and output electrodes 103 and 104 are composed of the same material as that of the electrode portion 11 (the electrode patterns 11A and 11B) for example.

The microresonator structure of FIGS. 1 to 4 includes other structural elements that are not illustrated in the drawings, in addition to a series of the above-described elements, i.e., the electrode portions 11 (the electrode patterns 11A and 11B) and the input and output electrodes 103 and 104. Examples of the "other structural elements" include a power supply for applying voltages to the DC applying electrode 102.

In the microresonator, as shown in FIGS. 1 to 4, when a voltage is applied through the DC applying electrode 102 to a series of the electrode portions 11, electrostatic force arises according to the voltage application. Thus, a series of the resonator elements F vibrate based on the electrical force to thereby cause resonance. Specifically, each vibration part 11BX of the electrode patterns 11B is displaced, while being supported by two support columns 11BY, recurrently between the position where the vibration part 11BX is located when being tensed and horizontally maintained and the position where the vibration part 11BX is located when bending down. Thus, a series of the resonator elements F resonate. In addition, signals are input and output via the input and output electrodes 103 and 104, and thus a signal of a certain frequency is extracted.

A method of manufacturing the microresonator of FIGS. 1 to 4 will be described below with reference to FIGS. 1 to 8. FIGS. 5 to 8 are diagrams explaining manufacturing steps of the microresonator, and each illustrate a sectional structure corresponding to that of FIG. 3. Manufacturing steps of the sectional structure of the microresonator of FIG. 3 will be described below mainly referring to FIGS. 3, and 5 to 8. Since structural characteristics of each element constituting the microresonator have been described above in detail, the description thereof will be omitted below.

Figure 5:
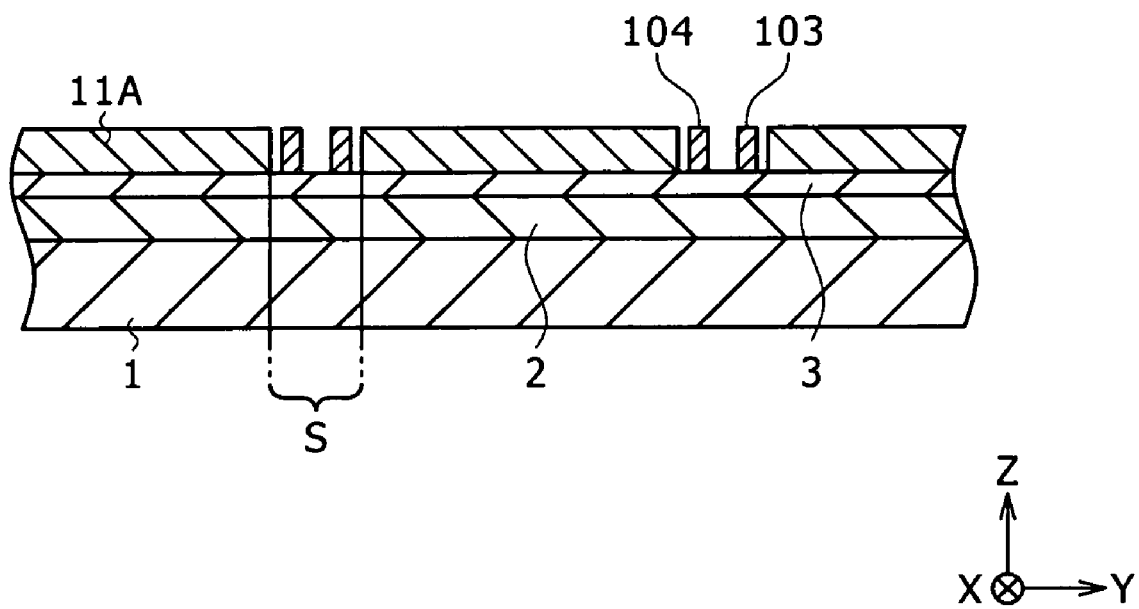
FIG. 5 is a sectional view explaining a manufacturing step of the microresonator according to the first embodiment of the invention.

When manufacturing the microresonator, initially the insulating layers 2 and 3 are deposited over the silicon substrate 1 as shown in FIG. 5. Specifically, the insulating layer 2 is formed by depositing an insulating material such as silicon dioxide by using low-pressure chemical vapor deposition (CVD), and then the insulating layer 3 is formed by depositing an insulating material such as silicon nitride by using low-pressure CVD similarly.

Subsequently, as shown in FIGS. 5 to 8, the plural electrode portions 11 are formed on the insulating layer 3 in a manner of extending in the Y-axis direction with repeatedly forming the plural resonator elements F and being arranged on the plural columns N across the X-axis direction. In particular, when forming the plural electrode portions 11, the plural resonator elements F1 constituting one part of the plural resonator elements F are formed to have the phase P1 and be arranged on the columns N1 that are located on every other column of the plural columns N. Furthermore, the plural resonator elements F2 constituting the other part of the plural resonator elements F are formed to have the phase P2 that is the opposite phase of the phase P1 and be arranged on the columns N2 that are located on every other column, other than the columns N1, of the plural columns N. The plural resonator elements F1 and F2 are formed so that the positions of the resonator elements F of the adjacent electrode portions 11 are offset relative to each other in the Y-axis direction, i.e., so that the resonator elements F1 and F2 are disposed on the different lines along the direction (the X-axis direction) intersecting with the extension direction of the vibration part 11BX (the Y-axis direction) as shown in FIGS. 2 and 3.

A procedure of forming the electrode portions 11, and the input and output electrodes 103 and 104 is as follows, for example.

Specifically, initially a film composed of a semiconductor material such as poly-Si including phosphorous is formed to cover the insulating layer 3 by using low-pressure CVD for example. The semiconductor material film is then patterned by using photolithography and dry etching. Thus, the plural electrode patterns 11A constituting one part of the electrode portions 11 are formed in a manner of being repeatedly disposed along the Y-axis direction with the intervals S thereamong as shown in FIG. 5. In addition, the plural electrode patterns 11A are juxtaposed to each other across the X-axis direction with the gaps G thereamong. More specifically, the electrode patterns 11A are disposed so that, when the plural electrode portions 11 will be completed, the plural resonator elements F1 and F2 are offset relative to each other in the Y-axis direction, and the resonator elements F are staggered in relation to each other in particular. Note that patterning treatment employing the above-described photolithography and dry etching will simply be referred to as "patterning" below.

When forming the electrode patterns 11A, another semiconductor material film is patterned in the same step as the forming step of the electrode patterns 11A for example, to thereby pattern-forming the input and output electrodes 103 and 104 as shown in FIG. 5. The input and output electrodes 103 and 104 are formed to be juxtaposed to each other and extend along the electrode patterns 11A and the X-axis direction with passing through the intervals S and the gaps G as shown in FIG. 2. In particular, the electrodes are disposed so that the positional relationship between the juxtaposed input and output electrodes 103 and 104 on the columns N1 is opposite to that on the columns N2.

Figure 6:
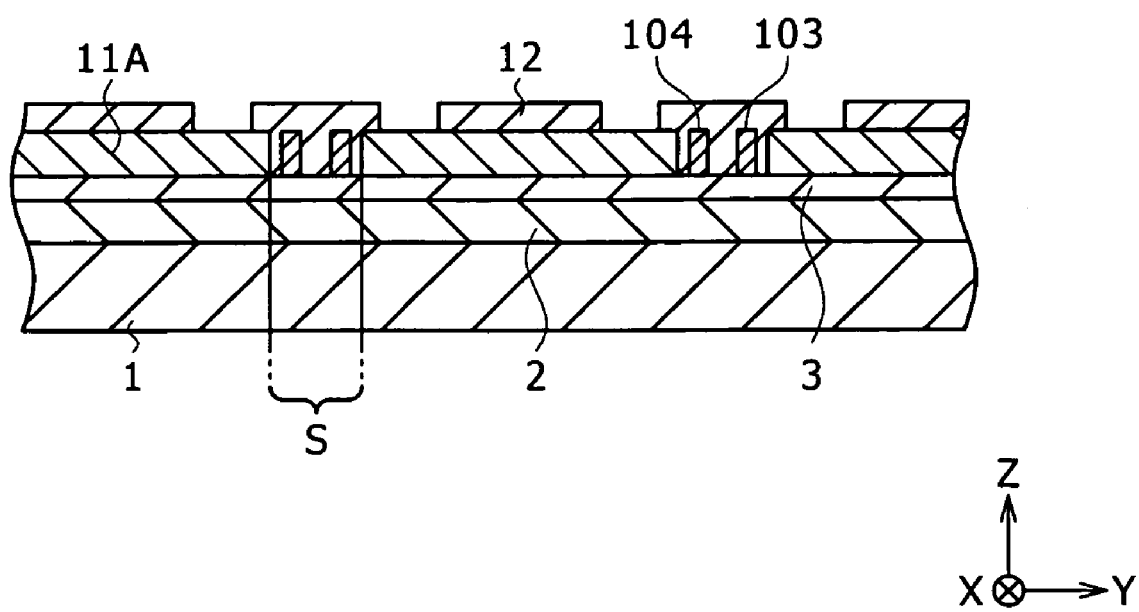
FIG. 6 is a sectional view explaining a step subsequent to the step of FIG. 5.

Subsequently, an insulating material film composed of a silicon oxide or the like is formed to fill the intervals S by using low-pressure CVD for example, and then the insulating material film is patterned to thereby form a sacrificial film 12 filling the intervals S as shown in FIG. 6. In order to form the electrode patterns 11B (refer to FIG. 7) having a beam-shaped sectional structure in the subsequent step, the sacrificial film 12 is formed in a manner of partially covering the electrode patterns 11A as well as filling the gaps S, to thereby partially expose the electrode patterns 11A.

Subsequently, a film composed of a semiconductor material such as poly-Si including phosphorous is formed to cover the exposed surfaces of the electrode patterns 11A and the sacrificial film 12 by using low-pressure CVD for example, and then the semiconductor material film is patterned. Thus, the plural electrode patterns 11B constituting the other part of the plural electrode portions 11 are formed on the electrode patterns 11A and the sacrificial film 12 in a manner of being repeatedly disposed along the Y-axis direction and coupling the electrode patterns 11A to each other with the sacrificial film 12 remaining among the electrode patterns 11A as shown in FIG. 7. The electrode pattern 11B includes the vibration part 11BX that can electrically resonate and two support columns 11BY provided for one and the other ends of the vibration part 11BX to support the vibration part 11BX. The vibration part 11BX and two support columns 11BY are integrally formed.

Subsequently, the sacrificial film 12 is dissolved with a dissolving liquid such as a solution of a diluted hydrogen fluoride (DHF), to thereby selectively remove the sacrificial film 12. Thus, as shown in FIG. 3, the intervals S are formed by the electrode patterns 11A and 11B on the regions on which the sacrificial film 12 has been provided, and the input and output electrodes 103 and 104 are disposed to pass through the intervals S and the gaps G. As a result, the plural electrode portions 11 are formed so that the electrode patterns 11A and 11B and the input and output electrodes 103 and 104 constitute the plural resonator elements F (the plural resonator elements F1 and F2), and so that the plural resonator elements F1 and F2 are offset relative to each other in the Y-axis direction in particular. Therefore, the microresonator structure 10 is formed that includes the plural electrode portions 11 (the electrode patterns 11A and 11B) and the input and output electrodes 103 and 104. Thus, the microresonator is completed in which the insulating layers 2 and 3 and the microresonator structure 10 are deposited in that order over the substrate 1.

In forming the microresonator structure 10 through the above-described manufacturing steps, after the electrode patterns 11B are formed through a series of the steps described referring to FIGS. 5 to 7, a wiring electrode 13 may be formed to partially cover the electrode pattern 11A on the outermost of the electrode portions 11 as shown in FIG. 8 for example. The wiring electrode 13 can be formed by, for example, depositing a conductive film composed of an alloy of aluminum and copper (AlCu), aluminum and silicon (AlSi) or the like by sputtering, and then patterning the conductive film.

In the microresonator according to the present embodiment, the plural resonator elements F are formed so that the plural resonator elements F1 and F2 arranged on the columns N1 and N2 have the phase P1 and the phase P2 opposite to the phase P1, respectively, based on the structural characteristic in that the positional relationship between the juxtaposed input and output electrodes 103 and 104 on the columns N1 is opposite to that on the columns N2. Thus, a desired frequency characteristic can be ensured since the influence of mutual interference arising among the resonator elements F is suppressed for the following reason.

Figure 10:
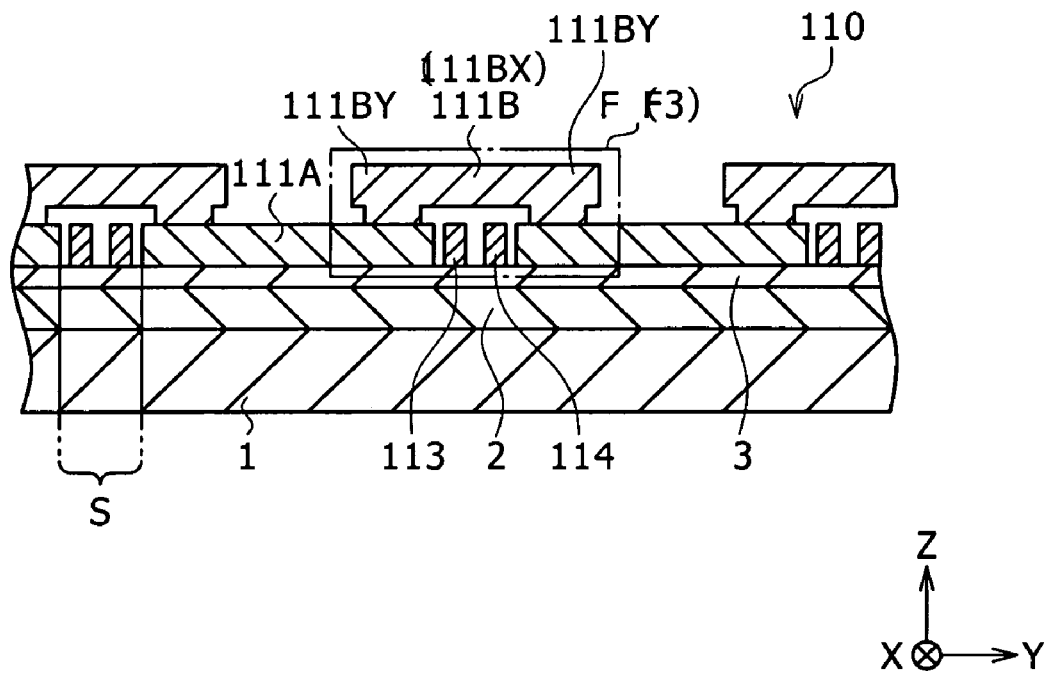
FIG. 10 is a sectional view illustrating the sectional structure of a resonant circuit along the line A-A of FIG. 9 (sectional structure along the YZ-plane)
Figure 11:
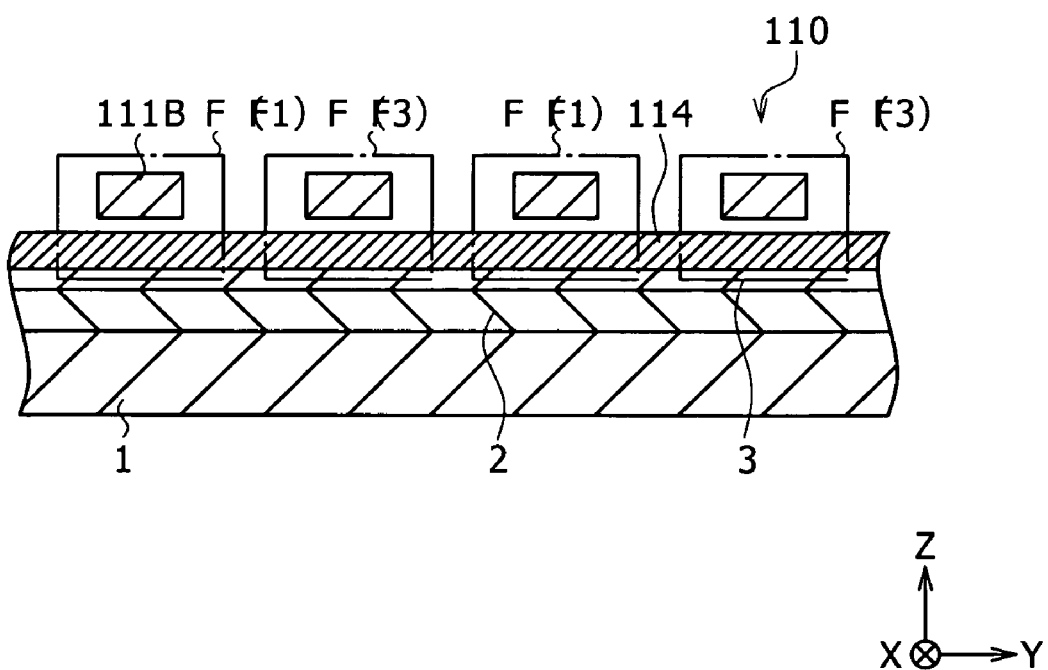
FIG. 11 is a sectional view illustrating the sectional structure of the resonant circuit along the line B-B of FIG. 9 (sectional structure along the XZ-plane)
Figure 12:
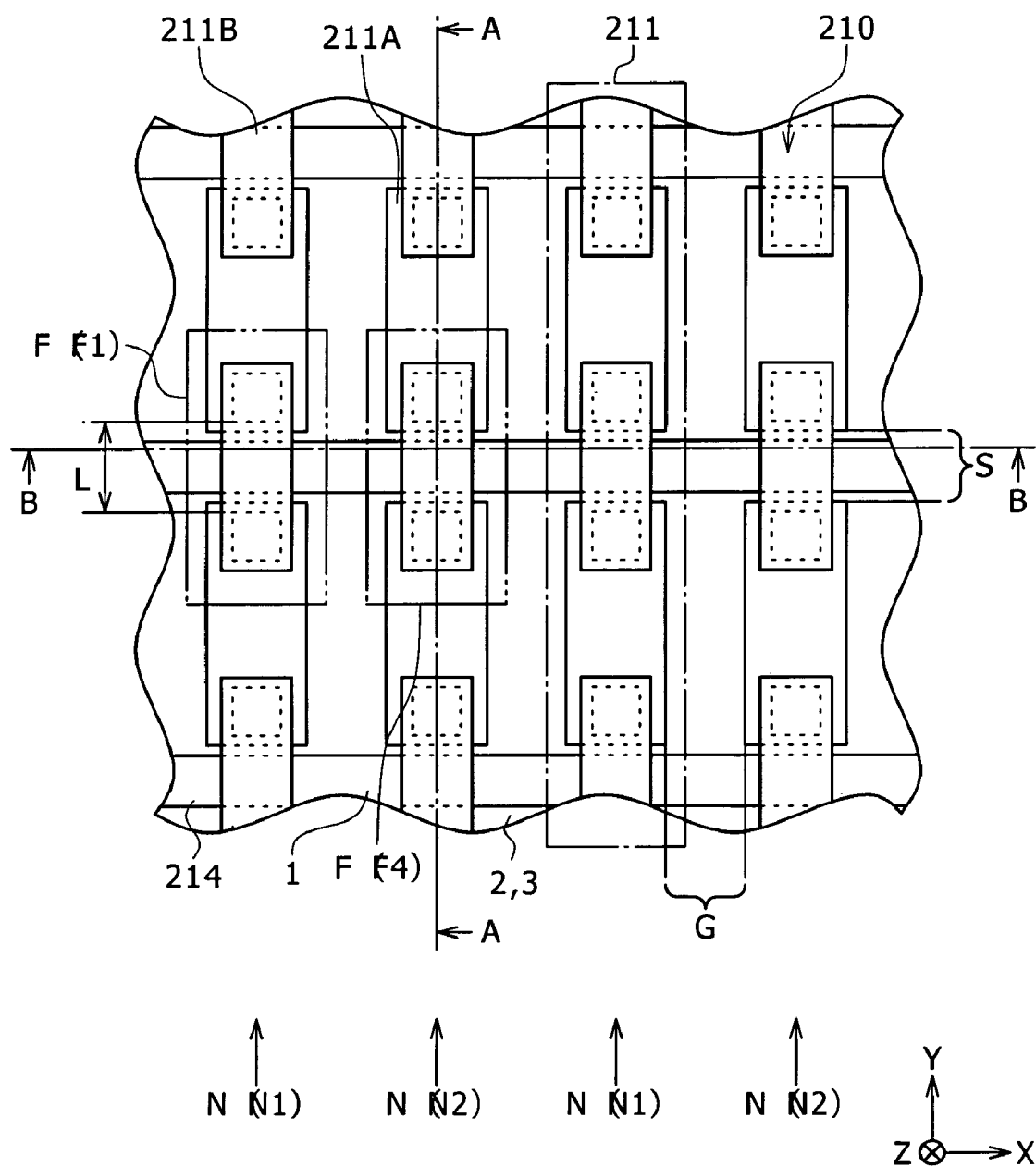
FIG. 12 is a plan view illustrating the planar structure (planar structure along the XY-plane) of a microresonator of a second comparative example against the microresonator according to the first embodiment of the invention.
Figure 13:
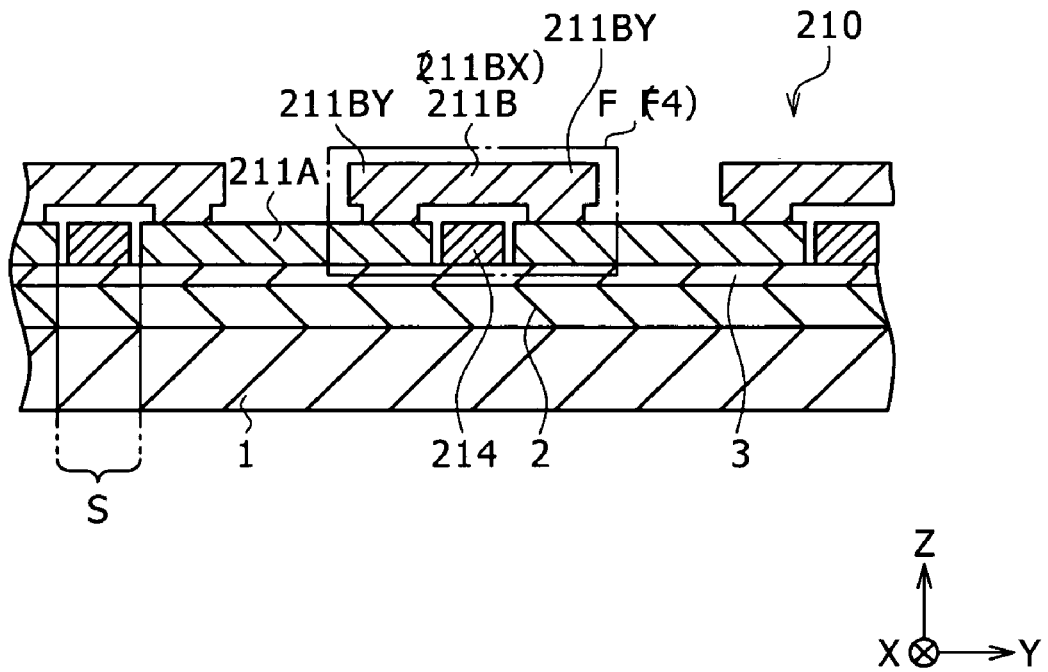
FIG. 13 is a sectional view illustrating the sectional structure of a resonant circuit along the line A-A of FIG. 12 (sectional structure along the YZ-plane)
Figure 14:
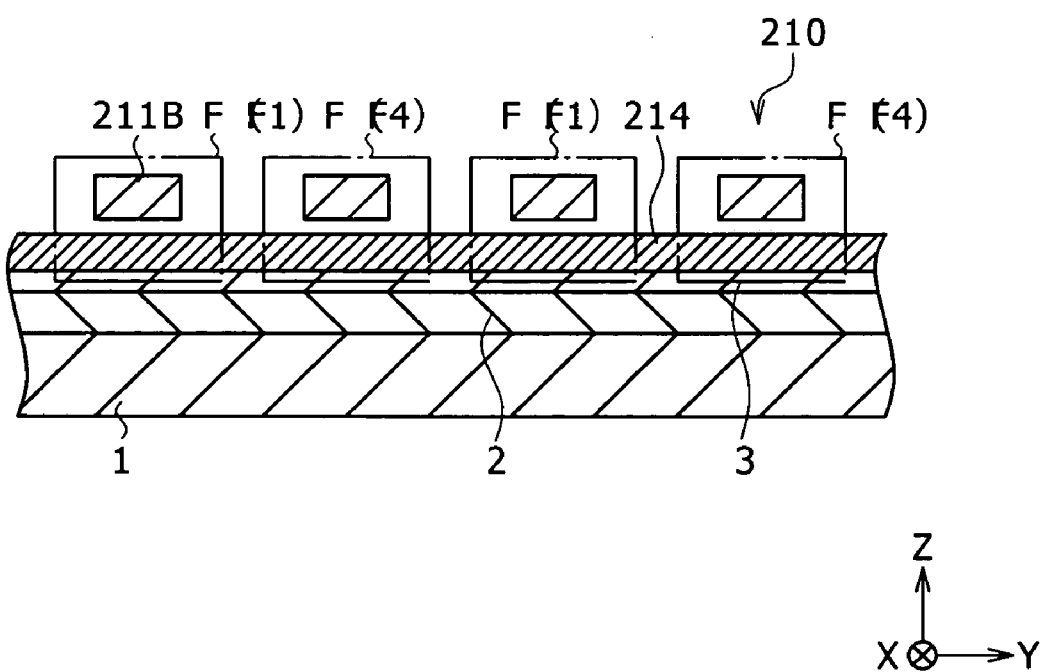
FIG. 14 is a sectional view illustrating the sectional structure of the resonant circuit along the line B-B of FIG. 12 (sectional structure along the XZ-plane)

FIGS. 9 to 11 illustrate the structure of a microresonator as a first comparative example against the microresonator according to the present embodiment, and correspond to FIGS. 2 to 4, respectively. In addition, FIGS. 12 to 14 illustrate the structure of a microresonator as a second comparative example against the microresonator according to the present embodiment, and correspond to FIGS. 2 to 4, respectively. The structure of the microresonator of the first comparative example shown in FIGS. 9 to 11 is the same as that of the microresonator according to the present embodiment, except that the comparative microresonator includes a microresonator structure 110 corresponding to the microresonator structure 10, i.e., a three-port structure having an electrode portion 111 (electrode patterns 111A and 111B (vibration part 111BX and support column 111BY)), an input electrode 113 and an output electrode 114 that correspond to the electrode portion 11 (the electrode patterns 11A and 11B (the vibration part 11BX and the support column 11BY)), the input electrode 103 and the output electrode 104, respectively. In the microresonator according to the present embodiment, the plural resonator elements F are arranged so that the plural resonator elements F1 and F2 arranged on the columns N1 and N2, respectively, are offset relative to each other in the extension direction of the vibration part 11BX (the Y-axis direction). Moreover, the positional relationship between the juxtaposed input and output electrodes 103 and 104 on the columns N1 is opposite to that on the columns N2. In contrast to this, in the microresonator of the first comparative example, the plural resonator elements F are arranged so that the plural resonator elements F1 and F3 disposed on the columns N1 and N2, respectively, are adjacent to each other in the direction perpendicular to the extension direction of the vibration part 111BX (the Y-axis direction). In addition, the positional relationship between the juxtaposed input and output electrodes 103 and 104 on the columns N1 is the same as that on the columns N2. Thus, in the microresonator of the first comparative example, both the plural resonator elements F1 and F3 have the same phase P1. The structure of the microresonator of the second comparative example shown in FIGS. 12 to 14 is the same as that of the microresonator according to the embodiment, except that the comparative microresonator includes a microresonator structure 210 corresponding to the microresonator structure 10, i.e., a two-port structure having an electrode portion 211 (electrode patterns 211A and 211B (vibration part 211BX and support column 211BY)), and an output electrode 214 that correspond to the electrode portion 11 (the electrode patterns 11A and 11B (the vibration part 11BX and the support column 11BY)), and the output electrode 104, respectively. In the microresonator of the second comparative example, as with the microresonator of the first comparative example, the plural resonator elements F are arranged so that the plural resonator elements F1 and F4 disposed on the columns N1 and N2, respectively, are adjacent to each other in the direction perpendicular to the extension direction of the vibration part 211BX (the Y-axis direction). Thus, in the microresonator of the second comparative example, both the plural resonator elements F1 and F4 have the same phase P1.

The microresonator of the first comparative example (FIGS. 9 to 11) suffers a large influence of mutual interference arising among the resonator elements F due to the structural factor in that both the plural resonator elements F1 and F3 have the same phase P1. Thus, the frequency characteristic is more susceptible to deterioration due to the influence of mutual interference among the resonator elements F. The deterioration of the frequency characteristic is more significant if variation in the length L of the vibration part 111BX (refer to FIG. 9) among the resonator elements F is larger in particular. The problem residing in the microresonator of the first comparative example similarly arises also in the microresonator of the second comparative example (FIGS. 12 to 14), which has the same structural factor as that of the microresonator of the first comparative example, i.e., which includes the plural resonator elements F1 and F4 that both have the same phase P1.

In contrast, the microresonator according to the present invention (FIGS. 2 to 4) has the structural characteristic in that the plural resonator elements F1 have the phase P1 while the plural resonator elements F2 have the phase P2 that is the opposite phase of the phase P1. Therefore, the influence of mutual interference arising among the resonator elements F is suppressed compared with the microresonators of the first and second comparative examples, in which all the plural resonator elements F1, F3 and F4 have the same phase P1. This phase opposition suppresses the deterioration of the frequency characteristic due to the influence of mutual interference arising among the resonator elements F. In addition, even if there is variation in the length L of the vibration part 11BX (refer to FIG. 2) among the resonator elements F, the influence of the variation in the length L of the vibration part 11BX is smaller than that in the microresonators of the first and second comparative examples. Accordingly, the present embodiment can suppress the influence of mutual interference arising among the resonator elements F and thus can ensure a desired frequency characteristic.

Furthermore, since the plural resonator elements F1 and F2 are offset relative to each other in the Y-axis direction in particular, the influence of mutual interference among the resonator elements F can be further suppressed for the following reason. Specifically, in the microresonator of the first comparative example, the resonator elements F are close to each other attributed to the structural factor in that the plural resonator elements F1 and F3 are adjacent to each other in the direction perpendicular to the extension direction of the vibration part 111BX (the Y-axis direction). These adjacent positions increase the influence of mutual interference arising among the resonator elements F. Therefore, the frequency characteristic is more susceptible to deterioration due to the influence of the mutual interference. It is obvious that the problem residing in the microresonator of the first comparative example similarly arises also in the microresonator of the second comparative example (FIGS. 12 to 14), which has the same structural factor as that of the microresonator of the first comparative example, i.e., which includes the plural resonator elements F1 and F4 that are adjacent to each other in the direction perpendicular to the extension direction of the vibration part 211BX (the Y-axis direction). On the contrary, in the microresonator according to the present embodiment (FIGS. 2 to 4), the distance among the resonator elements F is sufficiently large based on the structural characteristic in that the plural resonator elements F1 and F2 are offset relative to each other in the extension direction of the vibration part 11BX (the Y-axis direction), unlike the microresonators of the first and second comparative examples having the resonator elements F close to each other. This large distance suppresses the influence of mutual interference arising among the resonator elements F. Thus, the frequency characteristic is less susceptible to deterioration due to the influence of the mutual interference. Accordingly, the present embodiment can further suppress the influence of mutual interference among the resonator elements F.

Furthermore, the present embodiment arranges the plural resonator elements F1 and F2 in a staggered manner. This staggered arrangement maximizes the distance among the resonator elements F. Therefore, the influence of mutual interference arising among the resonator elements F is suppressed to the minimum, which can significantly improve the frequency characteristic.

In addition, the present embodiment can ensure a desired frequency characteristic even if the resonator elements F involve variation in the length L of the vibration part 11BX as described above. Therefore, there is no need to accept an unwanted waste of space of the microresonator in order to prevent the deterioration of the frequency characteristic due to variation in the length L of the vibration part 11BX. Specifically, for example, the microresonator structure 10 having the plural resonator elements F does not need to include the resonator elements F involving variation in the length L of the vibration part 11BX as a dummy pattern not to be used (not to be used as resonator elements F substantially). Therefore, since the unnecessary increase of size of the microresonator attributed to the presence of a dummy pattern is prevented, the miniaturization of the microresonator can be achieved.

In addition, a manufacturing method of the microresonator according to the present embodiment does not employ novel and complicated manufacturing processes but employs only existing thin-film processes including film deposition techniques typified by low-pressure CVD, patterning techniques typified by photolithography and dry etching, and partial removal techniques utilizing dissolution of the sacrificial film 12. Specifically, by using only these existing techniques, the microresonator is manufactured in which the plural resonator elements F are formed so that the plural resonator elements F1 and F2 arranged on the columns N1 and N2 have the phase P1 and the phase P2 opposite to the phase P1, respectively, based on the structural characteristic in that the positional relationship between the juxtaposed input and output electrodes 103 and 104 on the columns N1 is opposite to that on the columns N2. Accordingly, the present embodiment can easily manufacture the microresonator ensuring a desired frequency characteristic by using only existing thin-film processes.

Second Embodiment

A second embodiment according to the invention will be described below.

Figure 15:
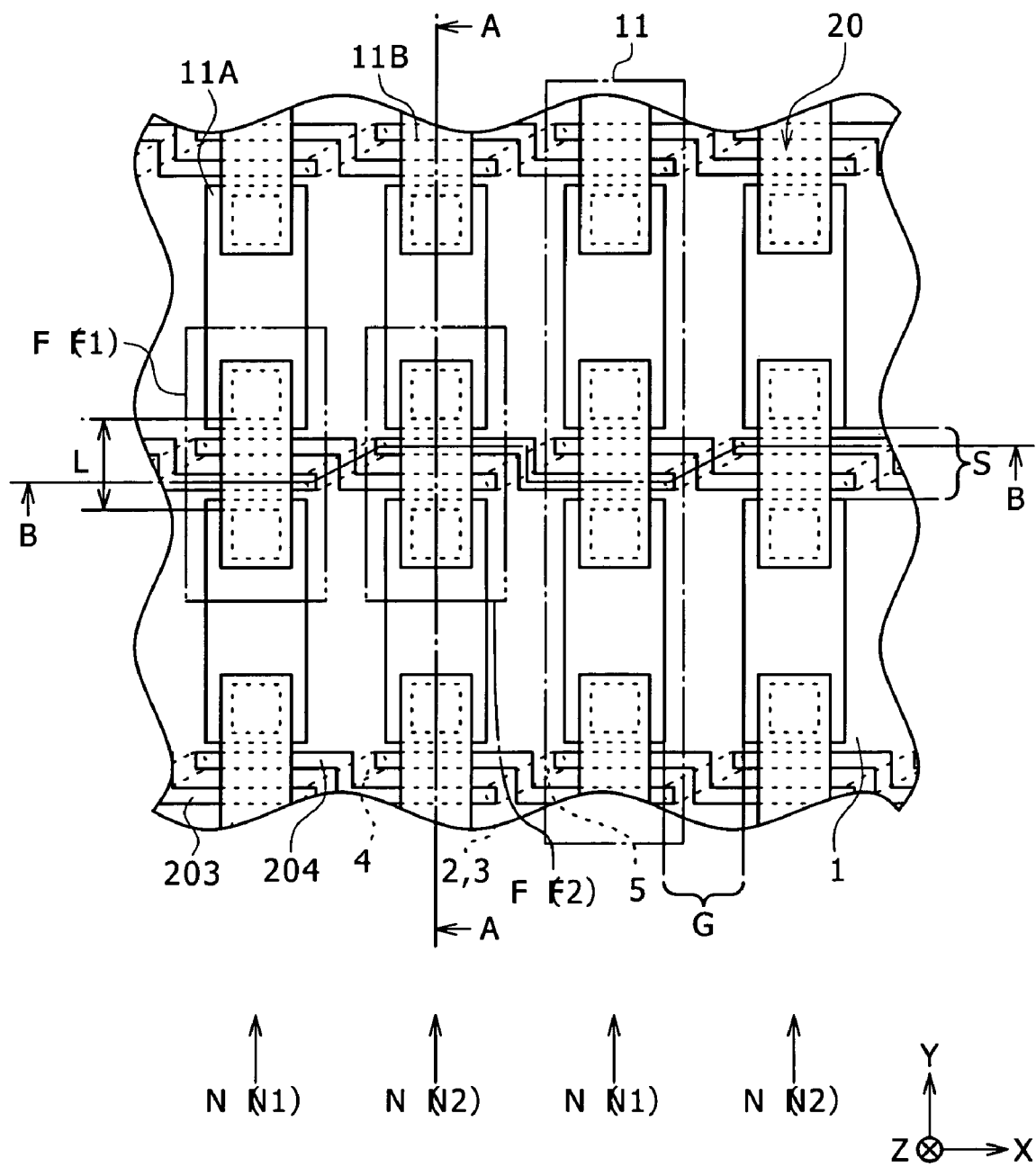
FIG. 15 is a plan view illustrating in a magnified form the planar structure (planar structure along the XY-plane) of a resonant circuit of a microresonator according to a second embodiment of the invention.
Figure 16:
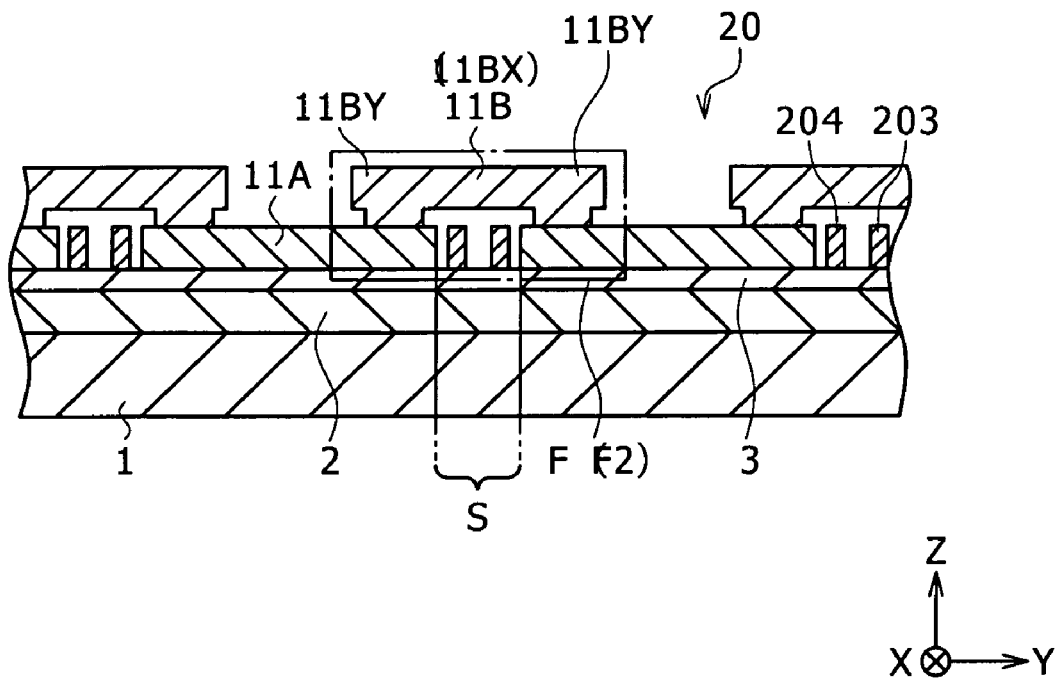
FIG. 16 is a sectional view illustrating the sectional structure of the resonant circuit along the line A-A of FIG. 15 (sectional structure along the YZ-plane)
Figure 17:
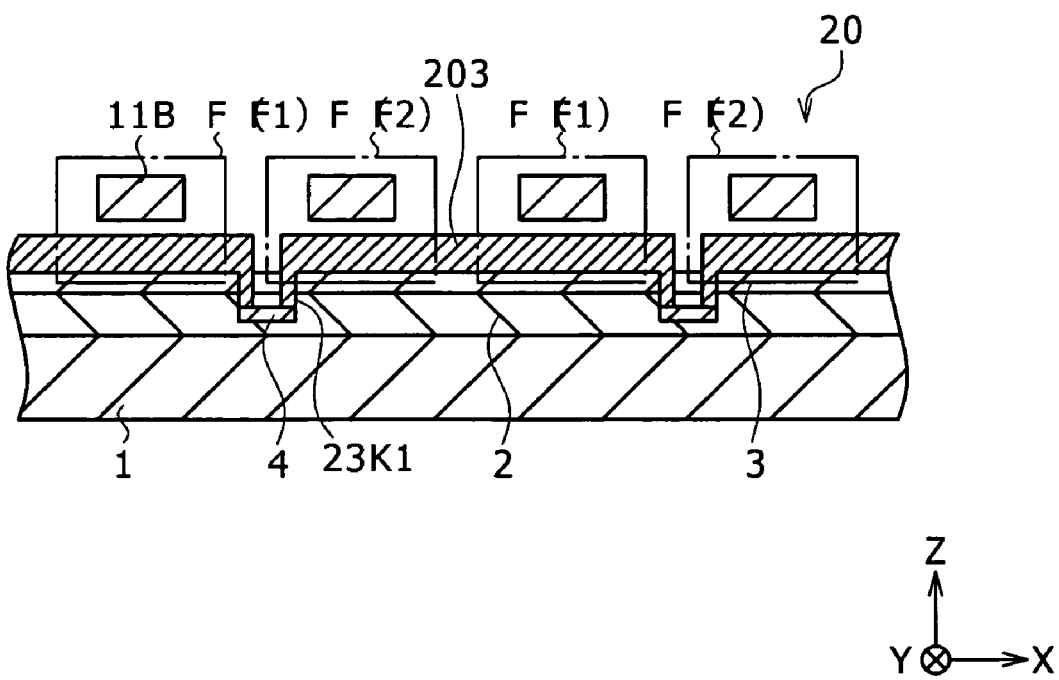
FIG. 17 is a sectional view illustrating the sectional structure of the resonant circuit along the line B-B of FIG. 15 (sectional structure along the XZ-plane)

Initially, the structure of a microresonator according to a second embodiment of the invention will be described with reference to FIGS. 15 to 17. FIGS. 15 to 17 illustrate the structure of the resonant circuit 101 shown in FIG. 1 in a magnified form. FIG. 15 illustrates the planar structure (planar structure along the XY-plane). FIG. 16 illustrates the sectional structure along the line A-A of FIG. 15 (sectional structure along the YZ-plane). FIG. 17 illustrates the sectional structure along the line B-B of FIG. 15 (sectional structure along the XZ-plane).

The microresonator according to the present embodiment has almost the same structure as that of the microresonator of the first embodiment (refer to FIGS. 1 to 4), except that the present embodiment includes a microresonator structure 20 instead of the microresonator structure 10, and the microresonator structure 20 includes an input electrode 203 and an output electrode 204 instead of the input and output electrodes 103 and 104.

Referring to FIGS. 15 to 17, the microresonator structure 20 has a structure in which a plurality of resonator elements F composed of a plurality of electrode portions 11 (the electrode patterns 11A and 11B) are arranged on a plurality of columns N. Specifically, the microresonator structure 20 includes a plurality of resonator elements F1 arranged on the columns N1 and having the phase P1, and a plurality of resonator elements F2 arranged on the columns N2 and having the phase P2. More specifically, in the microresonator structure 20, the input and output electrodes 203 and 204 are juxtaposed to each other in each resonator element F in a manner of extending in the direction (the X-axis direction) intersecting with the extension direction of the vibration part 11BX (the Y-axis direction). The positional relationship between the juxtaposed input and output electrodes 203 and 204 on the columns N1 is opposite to that on the columns N2. Referring to FIG. 15, the plural resonator elements F1 and F2 are arranged to be adjacent to each other in the direction perpendicular to the extension direction of the vibration part 11BX (the Y-axis direction). Specifically, in the microresonator structure 20, the plural electrode portions 11 are arranged so that the positions of the resonator elements F (F1 and F2) are adjacent to each other in the direction perpendicular to the Y-axis direction between the adjacent electrode portions 11.

As shown in FIGS. 15 and 17, a plurality of coupling electrodes 4 for coupling the input electrodes 203 to each other are buried in the insulating layer 2. In addition, a plurality of coupling holes 23K1 for electrical coupling are provided in regions in the insulating layers 2 and 3, corresponding to one and the other ends of the coupling electrodes 4. Furthermore, a plurality of coupling electrodes 5 for coupling the output electrodes 204 to each other are also buried in the insulating layer 2 as shown in FIG. 15. A plurality of coupling holes (not shown) corresponding to the coupling holes 23K1 are also provided in regions in the insulating layers 2 and 3, corresponding to one and the other ends of the coupling electrodes 5.

The input and output electrodes 203 and 204 extend to pass through the intervals S and the gaps G as shown in FIG. 15. Specifically, the electrodes are disposed to pass through between two adjacent resonator elements F (the resonator elements F1 and F2). Both the input and output electrodes 203 and 204 have a crank-shaped planar structure for example. Both one and the other ends of each input electrode 203 are extended downward through the coupling holes 23K1 provided in the insulating layers 2 and 3, so as to be coupled to the coupling electrodes 4. Thus, the plural input electrodes 203 are coupled to each other via the plural coupling electrodes 4. Similarly, both one and the other ends of the respective output electrodes 203 are extended downward through the coupling holes (not shown) provided in the insulating layers 2 and 3, so as to be coupled to the coupling electrodes 5. Thus, the plural output electrodes 204 are coupled to each other via the plural coupling electrodes 5. The input and output electrodes 203 and 204, and the coupling electrodes 4 and 5 are composed of the same material as that of the input and output electrodes 103 and 104 described in the first embodiment for example.

A method of manufacturing the microresonator of FIGS. 15 to 17 will be described below with reference to FIGS. 15 to 21. FIGS. 18 to 21 are diagrams explaining manufacturing steps of the microresonator, and each illustrate a sectional structure corresponding to that of FIG. 17. Manufacturing steps of the sectional structure of the microresonator of FIG. 17 will be described below mainly referring to FIGS. 17 to 21. Since characteristics of the structure and manufacturing method of each element constituting the microresonator have been described in detail in the first embodiment, the description thereof will be omitted below.

Figure 18:
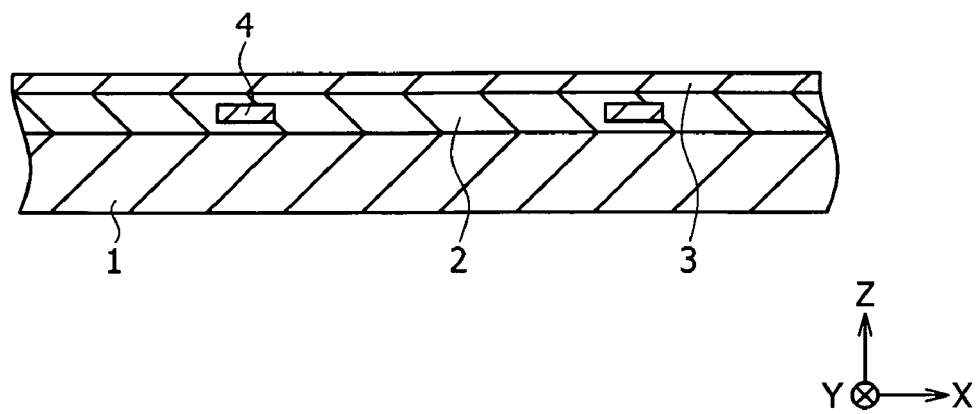
FIG. 18 is a sectional view explaining a manufacturing step of the microresonator according to the second embodiment of the invention.

In manufacturing the microresonator, as shown in FIG. 18, initially the insulating layers 2 and 3 are deposited on the substrate 1 through the procedure described in the first embodiment referring to FIG. 5. The insulating layer 2 is formed so that the plural coupling electrodes 4 are buried in part of the insulating layer 2. A procedure for burying the coupling electrodes 4 in the insulating layer 2 is as follows, for example: the lower part of the insulating layer 2 is formed; the plural coupling electrodes 4 are formed on the lower part; and the upper part of the insulating layer 2 is formed to cover the coupling electrodes 4 and the peripheral lower part. Thus, the plural coupling electrodes 4 are buried in the insulating layer 2 having a multi-layer structure of the lower and upper parts. When forming the insulating layer 2, the plural coupling electrodes 5 as well as the plural coupling electrodes 4 are buried in the insulating layer 2 as shown in FIG. 15 through the same procedure as the above-described procedure for forming the coupling electrodes 4.

Figure 19:
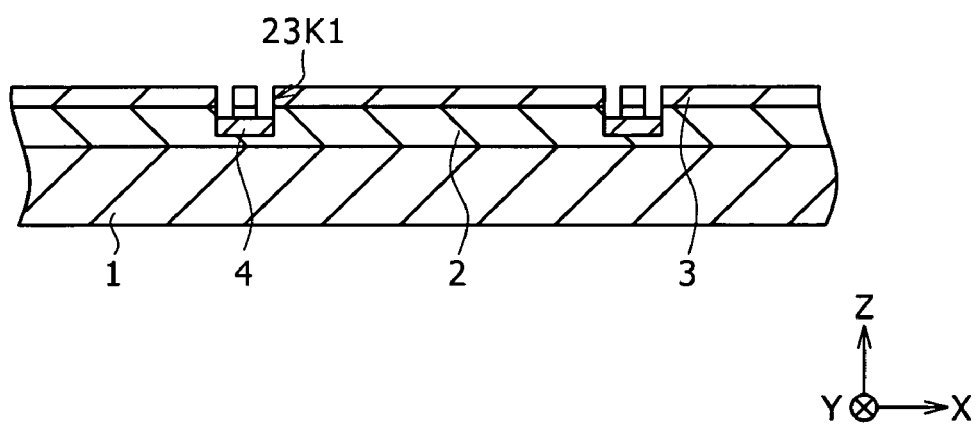
FIG. 19 is a sectional view explaining a step subsequent to the step of FIG. 18.

Subsequently, regions in the insulating layers 2 and 3, corresponding to one and the other ends of the respective coupling electrodes 4 are etch-removed by dry etching, to thereby form the plural coupling holes 23K1 in the insulating layers 2 and 3 as shown in FIG. 19. In forming the coupling holes 23K1, the insulating layers 2 and 3 are etched until one and the other ends of the coupling electrodes 4 are exposed. When forming the plural coupling holes 23K1 in the insulating layers 2 and 3, other plural coupling holes are also formed in regions in the insulating layers 2 and 3, corresponding to one and the other ends of the respective coupling electrodes 5 through the same procedure as the above-described procedure for forming the coupling holes 23K1.

Figure 20:
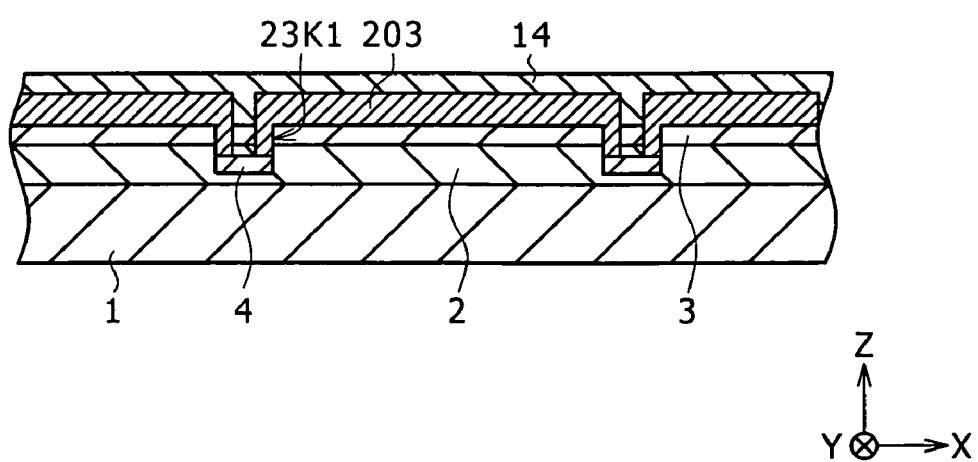
FIG. 20 is a sectional view explaining a step subsequent to the step of FIG. 19.

Subsequently, the plural electrode patterns 11A constituting one part of the electrode portions 11 are formed as shown in FIG. 15. In addition, the input and output electrodes 203 and 204 are pattern-formed in the same step as the forming step of the electrode patterns 11A as shown in FIGS. 15 and 20. As shown in FIG. 15, the input and output electrodes 203 and 204 are formed to have a crank-shaped planar structure in which the electrodes are juxtaposed to each other and extend in the X-axis direction with passing through the intervals S and the gaps G. In particular, the electrodes are disposed so that the positional relationship between the juxtaposed input and output electrodes 103 and 104 on the columns N1 is opposite to that on the columns N2. In addition, as shown in FIGS. 15 and 20, one and the other ends of the respective input electrodes 203 are extended downward through the coupling holes 23K1 provided in the insulating layers 2 and 3. Thus, the plural input electrodes 203 are electrically coupled to each other via the plural coupling electrodes 4. When electrically coupling the plural input electrodes 203 to each other via the plural coupling electrodes 4, the plural output electrodes 204 are also electrically coupled to each other via the plural coupling electrodes 5 through the same procedure as the above-described procedure for coupling the input electrodes 203.

Subsequently, as shown in FIGS. 15 and 20, a sacrificial film 14 is formed to fill the intervals S and cover the input and output electrodes 203 and 204, and the periphery thereof through the same procedure as that for forming the sacrificial film 12 described in the first embodiment. In order to form the electrode patterns 11B (refer to FIG. 21) in the subsequent step, the sacrificial film 14 is formed in a manner of partially covering the electrode patterns 11A as well as filling the gaps S, to thereby partially expose the electrode patterns 11A.

Figure 21:
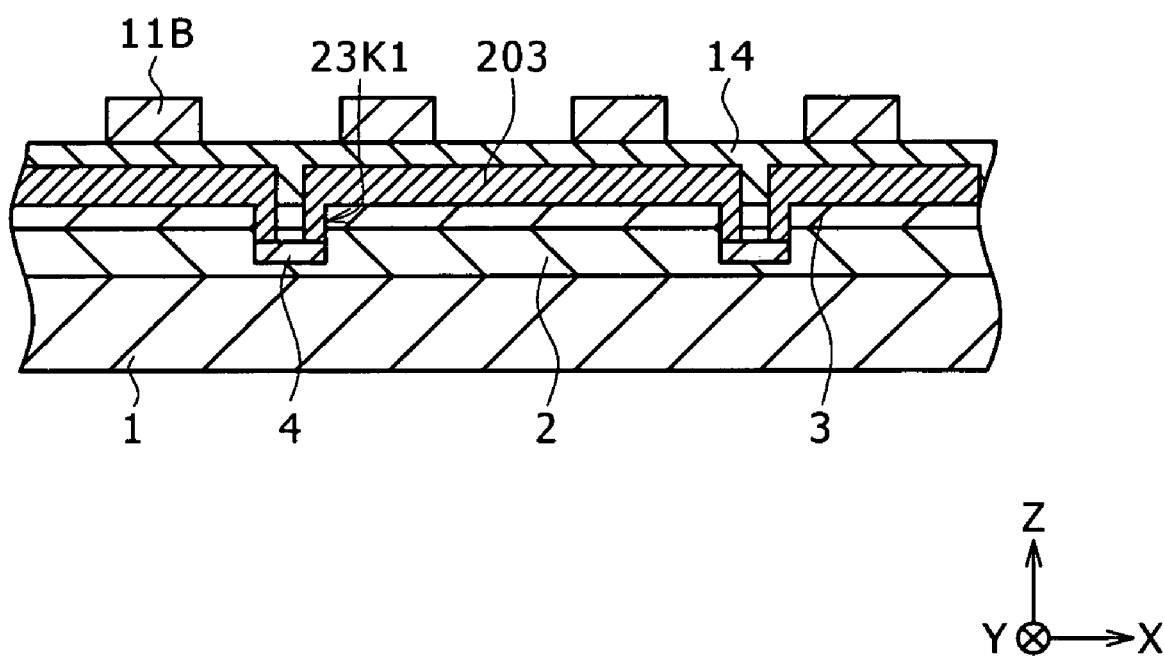
FIG. 21 is a sectional view explaining a step subsequent to the step of FIG. 20.

Subsequently, the plural electrode patterns 11B constituting the other part of the electrode portions 11 are formed on the electrode patterns 11A and the sacrificial film 14 as shown in FIGS. 15 and 21.

Subsequently, the sacrificial film 14 is dissolved with a dissolving liquid such as a solution of a diluted hydrogen fluoride (DHF), to thereby selectively remove the sacrificial film 14. Thus, as shown in FIGS. 15 to 17, the intervals S are formed by the electrode patterns 11A and 11B on the regions on which the sacrificial film 14 has been provided, and the input and output electrodes 203 and 204 are disposed to pass through the intervals S and the gaps G. As a result, the plural electrode portions 11 are formed so that the electrode patterns 11A and 11B and the input and output electrodes 203 and 204 constitute the plural resonator elements F (the plural resonator elements F1 and F2), and so that the plural resonator elements F1 and F2 are adjacent to each other in the direction perpendicular to the Y-axis direction in particular. Therefore, the microresonator structure 20 is formed that includes the plural electrode portions 11 (the electrode patterns 11A and 11B) and the input and output electrodes 203 and 204. Thus, the microresonator is completed in which the insulating layers 2 and 3 and the microresonator structure 20 are deposited in that order over the substrate 1.

In the microresonator according to the present embodiment, the plural resonator elements F1 and F2 arranged on the columns N1 and N2 have the phase P1 and the phase P2 opposite to the phase P1, respectively, based on the structural characteristic in that the positional relationship between the juxtaposed input and output electrodes 203 and 204 on the columns N1 is opposite to that on the columns N2. Thus, a desired frequency characteristic can be ensured since the influence of mutual interference arising among the resonator elements F is suppressed based on the same operation as that of the first embodiment.

In addition, a manufacturing method of the microresonator according to the present embodiment does not employ novel and complicated manufacturing processes but employs only existing thin-film processes. Specifically, by using only existing techniques, the microresonator is manufactured in which the plural resonator elements F1 and F2 arranged on the columns N1 and N2 have the phase P1 and the phase P2 opposite to the phase P1, respectively, based on the structural characteristic in that the positional relationship between the juxtaposed input and output electrodes 203 and 204 on the columns N1 is opposite to that on the columns N2. Accordingly, the present embodiment can easily manufacture the microresonator ensuring a desired frequency characteristic by using only existing thin-film processes based on the same operation as that of the first embodiment.

Figure 23:
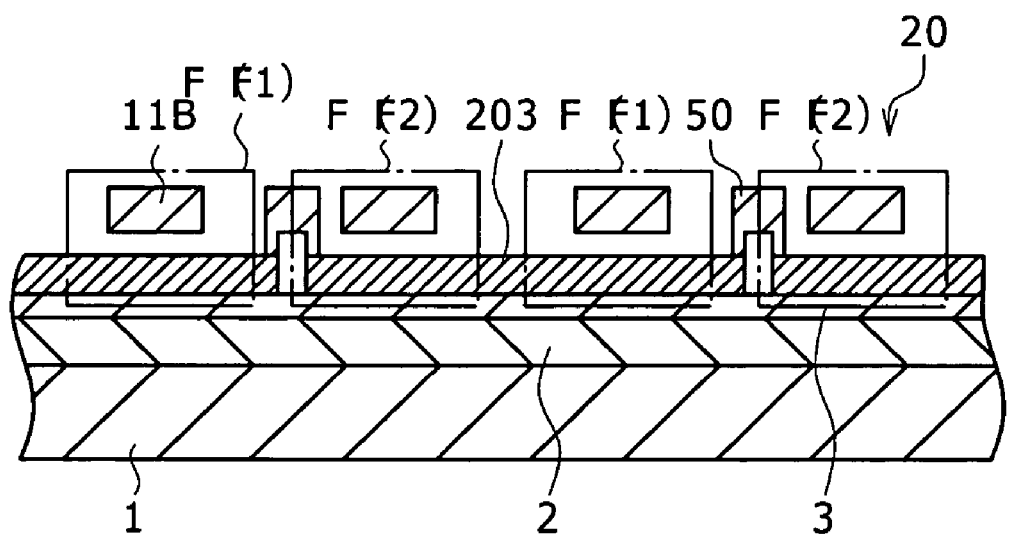
FIG. 23 is a sectional view illustrating the sectional structure of the resonant circuit along the line B-B of FIG. 22 (sectional structure along the YZ-plane)

In the present embodiment, the plural coupling electrodes 4 are buried in the insulating layer 2, and the input electrodes 203 are coupled to the coupling electrodes 4 via the plural coupling holes 23K1 formed in the insulating layers 2 and 3. Thus, the plural input electrodes 203 are electrically coupled to each other via the plural coupling electrodes 4 as shown in FIGS. 15 and 17. However, the structure of the microresonator is not limited thereto. Specifically, as shown in FIGS. 22 and 23 corresponding to FIGS. 15 and 17, respectively, a plurality of coupling electrodes 40 may be provided on the same layer-level as that of the electrode patterns 11B, and one and the other ends of each coupling electrode 40 may be extended downward and be coupled to two adjacent input electrodes 203. Thus, the plural input electrodes 203 may be electrically coupled to each other via the plural coupling electrodes 40. A procedure for forming the coupling electrodes 40 is as follows, for example: when forming the sacrificial film 14 as shown in FIG. 20, coupling holes for electrical coupling are provided in the sacrificial film 14; and the coupling electrodes 40 are formed in the same step as the forming step of the electrode patterns 11B in a manner of being extended downward through the coupling holes to thereby be coupled to two adjacent input electrodes 203. It is obvious that the coupling structure of the plural input electrodes 203 with the coupling electrodes 40 can also be applied to the coupling structure of the plural output electrodes 204. Specifically, the plural output electrodes 204 may be electrically coupled to each other via a plurality of coupling electrodes 50. Also in this case, the positional relationship between the juxtaposed input and output electrodes 203 and 204 on the columns N1 is opposite to that on the columns N2. Therefore, the plural resonator elements F1 have the phase P1 while the plural resonator elements F2 have the phase P2 that is the opposite phase of the phase P1, which provides the same advantages as those of the above-described embodiments.

Note that the structure, operation, procedures, effects, advantages and modifications, other than the above description, relating to the microresonator and manufacturing method thereof according to the present embodiment are the same as those of the first embodiment.

Third Embodiment

A third embodiment according to the invention will be described below.

Figure 24:
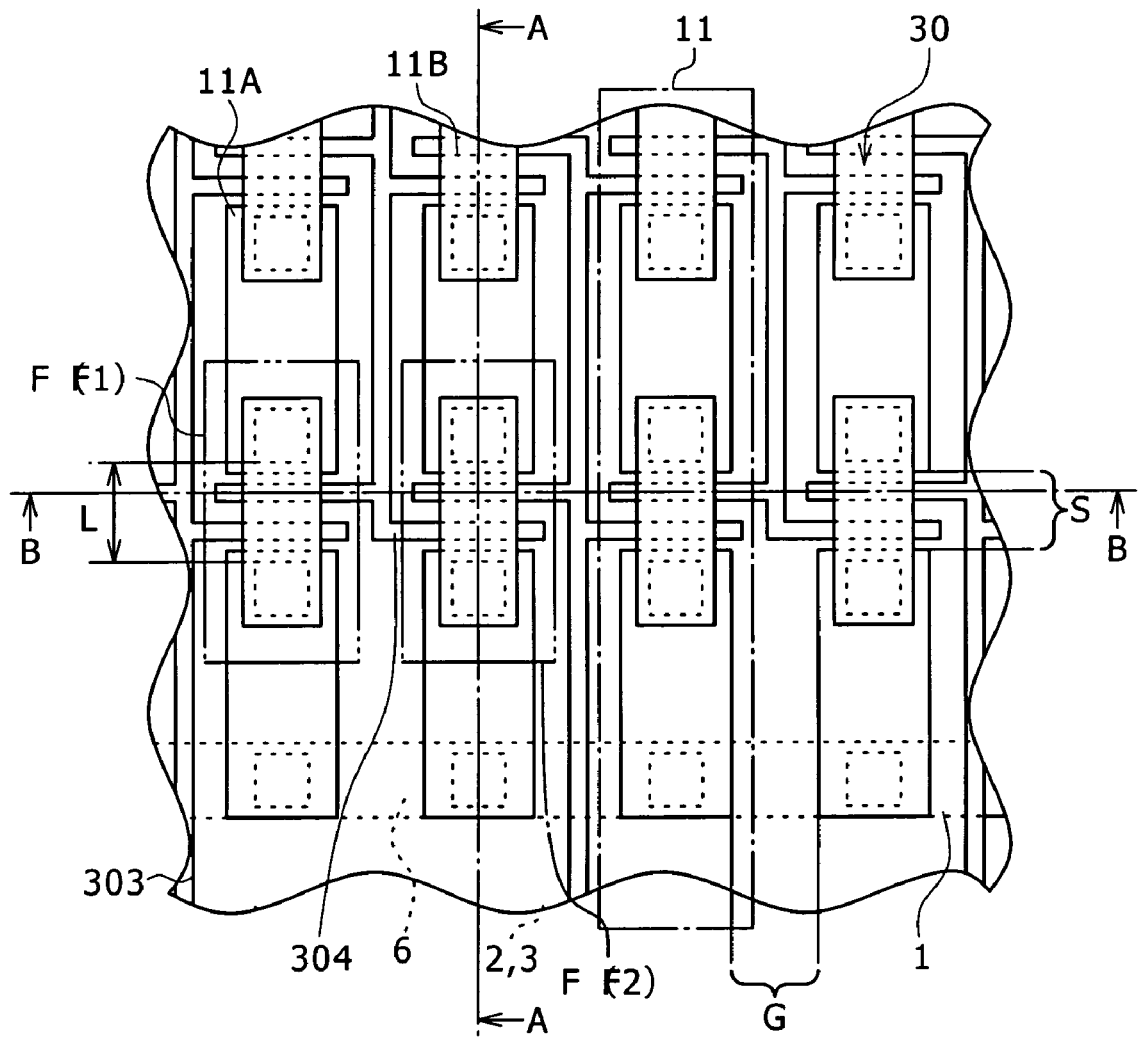
FIG. 24 is a plan view illustrating in a magnified form the planar structure (planar structure along the XY-plane) of a resonant circuit of a microresonator according to a third embodiment of the invention.
Figure 25:
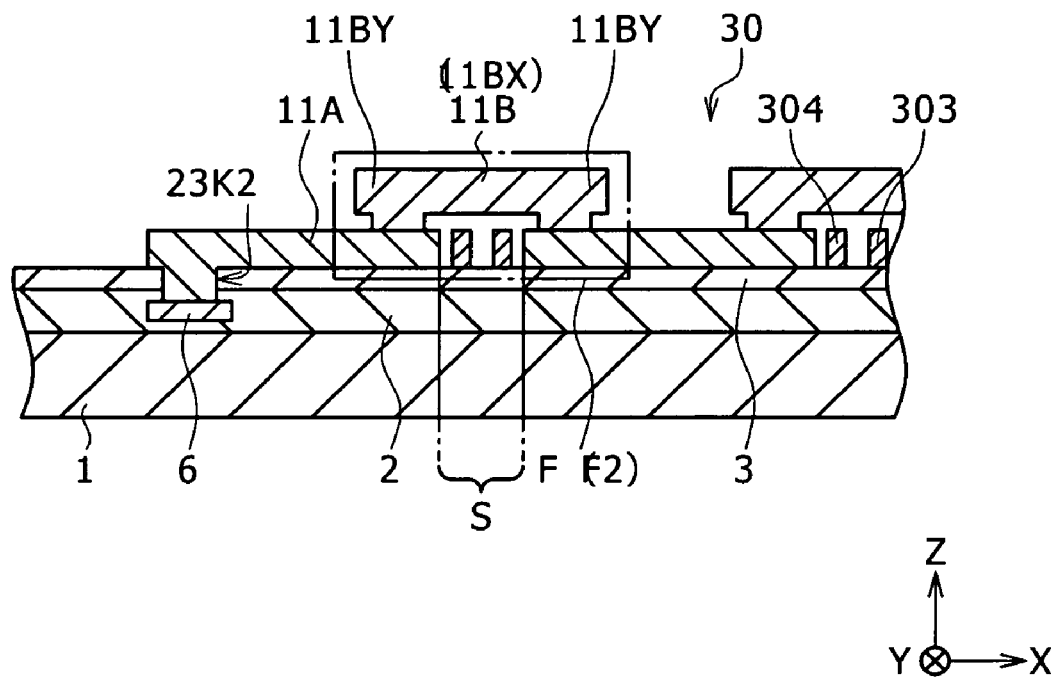
FIG. 25 is a sectional view illustrating the sectional structure of the resonant circuit along the line A-A of FIG. 24 (sectional structure along the XZ-plane)
Figure 26:
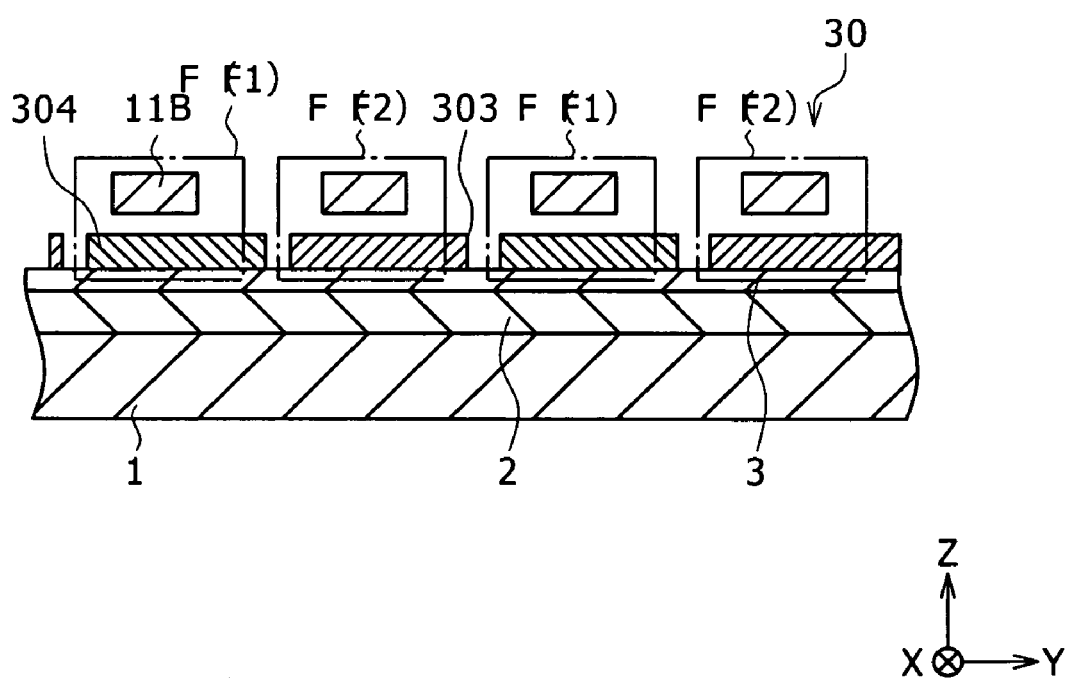
FIG. 26 is a sectional view illustrating the sectional structure of the resonant circuit along the line B-B of FIG. 24 (sectional structure along the YZ-plane)

Initially, the structure of a microresonator according to a third embodiment of the invention will be described with reference to FIGS. 24 to 26. FIGS. 24 to 26 illustrate the structure of the resonant circuit 101 shown in FIG. 1 in a magnified form. FIG. 24 illustrates the planar structure (planar structure along the XY-plane). FIG. 25 illustrates the sectional structure along the line A-A of FIG. 24 (sectional structure along the XZ-plane). FIG. 26 illustrates the sectional structure along the line B-B of FIG. 24 (sectional structure along the YZ-plane).

The microresonator according to the present embodiment has almost the same structure as that of the microresonator of the first embodiment (refer to FIGS. 1 to 4), except that the present embodiment includes a microresonator structure 30 instead of the microresonator structure 10, and the microresonator structure 30 includes an input electrode 303 and an output electrode 304 instead of the input and output electrodes 103 and 104.

Referring to FIGS. 24 to 26, the microresonator structure 30 has a structure in which a plurality of resonator elements F composed of a plurality of electrode portions 11 (the electrode patterns 11A and 11B) are arranged on a plurality of columns N. Specifically, the microresonator structure 30 includes a plurality of resonator elements F1 arranged on the columns N1 and having the phase P1, and a plurality of resonator elements F2 arranged on the columns N2 and having the phase P2 that is the opposite phase of the phase P1. More specifically, in the microresonator structure 30, the input and output electrodes 303 and 304 are juxtaposed to each other in each resonator element F in a manner of extending in the direction (the Y-axis direction) intersecting with the extension direction of the vibration part 11BX (the X-axis direction). The positional relationship between the juxtaposed input and output electrodes 303 and 304 on the columns N1 is opposite to that on the columns N2. Specifically, referring to FIG. 24, the plural resonator elements F1 and F2 are arranged to be adjacent to each other in the direction perpendicular to the extension direction of the vibration part 11BX (the X-axis direction).

As shown in FIGS. 24 and 25, an auxiliary electrode 6 for coupling the electrode portions 11 (the electrode patterns 11A at ends of the electrode portions 11) to each other is buried in the insulating layer 2. In the insulating layers 2 and 3, a plurality of coupling holes 23K2 for electrical coupling are provided in regions corresponding to intersections between the electrode portions 11 and the auxiliary electrode 6. One end of each electrode portion 11 is extended downward through the coupling hole 23K2 provided in the insulating layers 2 and 3, so as to be coupled to the auxiliary electrode 6. Thus, the plural electrode portions 11 are coupled to each other via the auxiliary electrode 6.

The input and output electrodes 303 and 304 extend to pass through the intervals S and the gaps G as shown in FIG. 24. Specifically, the electrodes are formed to have laterally extending branches between two adjacent resonator elements F (the resonator elements F1 and F2). Thus, both the input and output electrodes 303 and 304 have a branch-shaped planar structure that includes a plurality of branch parts extending laterally as shown in FIG. 24.

A method of manufacturing the microresonator of FIGS. 24 to 26 will be described below with reference to FIGS. 24 to 30. FIGS. 27 to 30 are diagrams explaining manufacturing steps of the microresonator, and each illustrate a sectional structure corresponding to that of FIG. 25. Manufacturing steps of the sectional structure of the microresonator of FIG. 25 will be described below mainly referring to FIGS. 25, and 27 to 30. Since characteristics of the structure and manufacturing method of each element constituting the microresonator have been described in detail in the first embodiment, the description thereof will be omitted below.

In manufacturing the microresonator, as shown in FIG. 27, initially the insulating layers 2 and 3 are deposited on the substrate 1 through the procedure described in the first embodiment referring to FIG. 5. The insulating layer 2 is formed so that the auxiliary electrode 6 is buried in part of the insulating layer 2. Examples of a procedure for burying the auxiliary electrode 6 in the insulating layer 2 includes a procedure similar to that for burying the coupling electrodes 4 in the insulating layer 2 in the second embodiment.

Subsequently, regions in the insulating layers 2 and 3, corresponding to intersections between the auxiliary electrode 6 and the plural electrode portions 11 to be formed in the subsequent step are etch-removed by dry etching, to thereby form the plural coupling holes 23K2 in the insulating layers 2 and 3 as shown in FIG. 28. In forming the coupling holes 23K2, the insulating layers 2 and 3 are etched until the auxiliary electrode 6 is exposed.

Subsequently, as shown in FIG. 29, the plural electrode patterns 11A constituting one part of the electrode portions 11 are formed, and the input and output electrodes 303 and 304 are pattern-formed in the same step as the forming step of the electrode patterns 11A. When forming the electrode patterns 11A, one end of each electrode pattern 11A is extended downward through the coupling hole 23K2 provided in the insulating layers 2 and 3, to thereby couple the plural electrode patterns 11A to the auxiliary electrode 6. In addition, as shown in FIG. 24, the input and output electrodes 303 and 304 are formed to have a branch-shaped planar structure in which the electrodes are juxtaposed to each other and extend in the Y-axis direction with passing through the intervals S and the gaps G. In particular, the electrodes are disposed so that the positional relationship between the juxtaposed input and output electrodes 303 and 304 on the columns N1 is opposite to that on the columns N2.

Subsequently, as shown in FIG. 29, a sacrificial film 15 is formed to fill the intervals S and cover the input and output electrodes 303 and 304, and the periphery thereof through the same procedure as that for forming the sacrificial film 12 described in the first embodiment. In order to form the electrode patterns 11B (refer to FIG. 30) in the subsequent step, the sacrificial film 15 is formed in a manner of partially covering the electrode patterns 11A as well as filling the gaps S, to thereby partially expose the electrode patterns 11A.

Subsequently, the plural electrode patterns 11B constituting the other part of the electrode portions 11 are formed on the electrode patterns 11A and the sacrificial film 15 as shown in FIG. 30.

Subsequently, the sacrificial film 15 is dissolved with a dissolving liquid such as a solution of a diluted hydrogen fluoride (DHF), to thereby selectively remove the sacrificial film 15. Thus, as shown in FIG. 25, the intervals S are formed by the electrode patterns 11A and 11B on the regions on which the sacrificial film 15 has been provided, and the input and output electrodes 303 and 304 are disposed to pass through the intervals S and the gaps G. As a result, the plural electrode portions 11 are formed so that the electrode patterns 11A and 11B and the input and output electrodes 303 and 304 constitute the plural resonator elements F (the plural resonator elements F1 and F2), and so that the plural resonator elements F1 and F2 are adjacent to each other in the Y-axis direction in particular. Therefore, the microresonator structure 30 is formed that includes the plural electrode portions 11 (the electrode patterns 11A and 11B) and the input and output electrodes 303 and 304. Thus, the microresonator is completed in which the insulating layers 2 and 3 and the microresonator structure 30 are deposited in that order over the substrate 1.

In the microresonator according to the present embodiment, the plural resonator elements F1 and F2 arranged on the columns N1 and N2 have the phase P1 and the phase P2 opposite to the phase P1, respectively, based on the structural characteristic in that the positional relationship between the juxtaposed input and output electrodes 303 and 304 on the columns N1 is opposite to that on the columns N2. Thus, a desired frequency characteristic can be ensured since the influence of mutual interference arising among the resonator elements F is suppressed based on the same operation as that of the first embodiment.

In addition, a manufacturing method of the microresonator according to the present embodiment does not employ novel and complicated manufacturing processes but employs only existing thin-film processes. Specifically, by using only existing techniques, the microresonator is manufactured in which the plural resonator elements F1 and F2 arranged on the columns N1 and N2 have the phase P1 and the phase P2 opposite to the phase P1, respectively, based on the structural characteristic in that the positional relationship between the juxtaposed input and output electrodes 303 and 304 on the columns N1 is opposite to that on the columns N2. Accordingly, the present embodiment can easily manufacture the microresonator ensuring a desired frequency characteristic by using only existing thin-film processes based on the same operation as that of the first embodiment.

Figure 31:
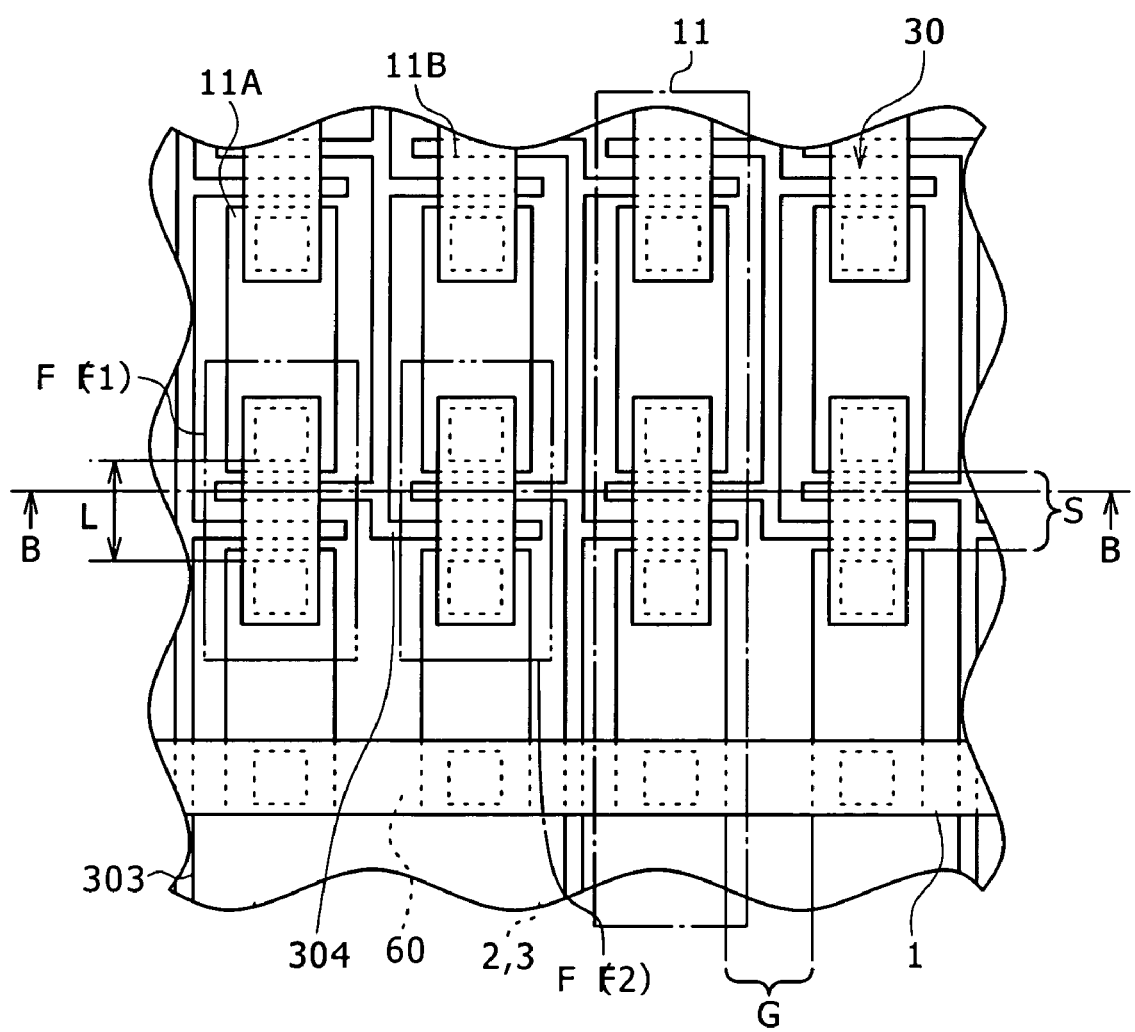
FIG. 31 is a plan view illustrating the planar structure (planar structure along the XY-plane) of a modification of the resonant circuit of the microresonator according to the third embodiment of the invention.
Figure 32:
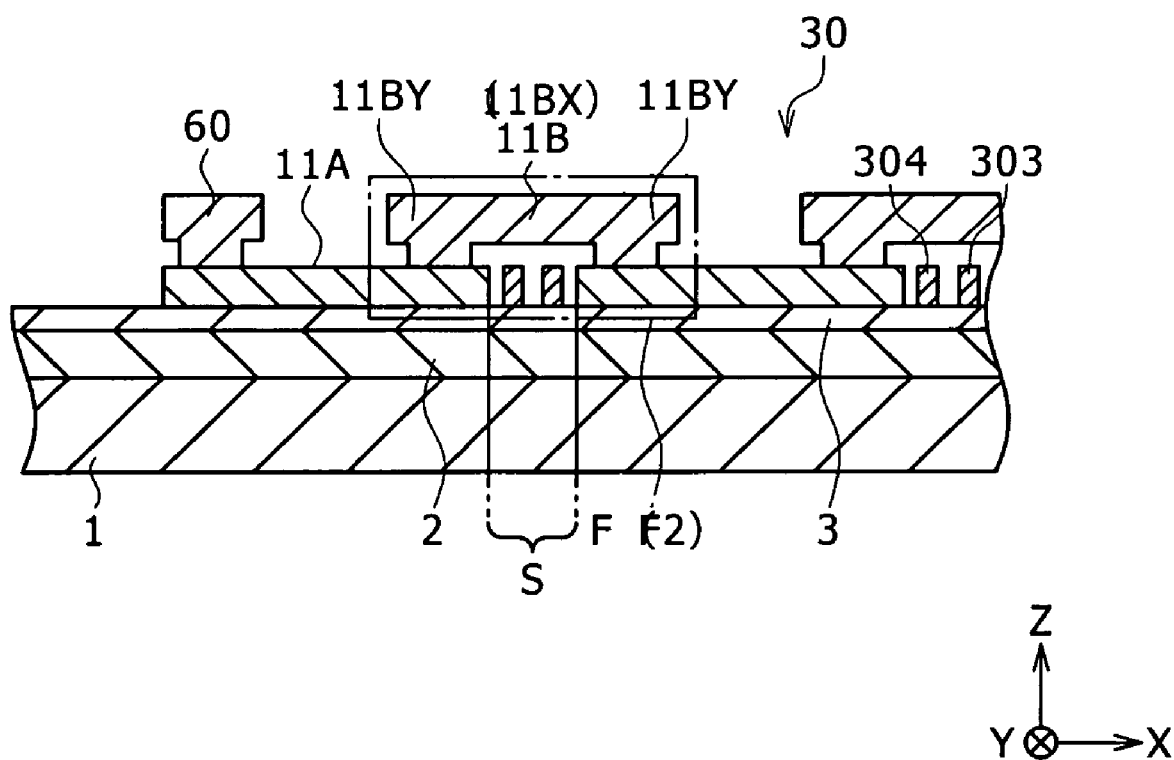
FIG. 32 is a sectional view illustrating the sectional structure of the resonant circuit along the line B-B of FIG. 31 (sectional structure along the XZ-plane)

In the present embodiment, the auxiliary electrode 6 is buried in the insulating layer 2, and the electrode portions 11 are coupled to the auxiliary electrode 6 via the coupling holes 23K2 formed in the insulating layers 2 and 3. Thus, the plural electrode portions 11 are electrically coupled to the auxiliary electrode 6, as shown in FIGS. 24 and 25. However, the structure of the microresonator is not limited thereto. Specifically, as shown in FIGS. 31 and 32 corresponding to FIGS. 24 and 25, respectively, an auxiliary electrode 60 may be provided on the same layer-level as that of the electrode patterns 11B, and may be extended downward and be coupled to the plural electrode portions 11. Thus, the plural electrode portions 11 may be electrically coupled to each other via the auxiliary electrode 60. A procedure for forming the auxiliary electrode 60 is as follows, for example: when forming the sacrificial film 15 as shown in FIG. 29, coupling holes for electrical coupling are provided in the sacrificial film 15; and the auxiliary electrode 60 is formed in the same step as the forming step of the electrode patterns 11B in a manner of being extended downward through the coupling holes to thereby be coupled to the respective electrode patterns 11A. Also in this case, the positional relationship between the juxtaposed input and output electrodes 303 and 304 on the columns N1 is opposite to that on the columns N2. Therefore, the plural resonator elements F1 have the phase P1 while the plural resonator elements F2 have the phase P2 that is the opposite phase of the phase P1, which provides the same advantages as those of the above-described embodiments.

Note that the structure, operation, procedures, effects, advantages and modifications, other than the above description, relating to the microresonator and manufacturing method thereof according to the present embodiment are the same as those of the first embodiment.

The description relating to the microresonators and manufacturing methods thereof according to the embodiments of the invention have been completed.

The structure of an electronic apparatus including the microresonator according to the embodiments of the invention will be described below referring to FIG. 33. FIG. 33 illustrates the block configuration of a communication device as the electronic apparatus.

The communication device shown in FIG. 33 includes the microresonator described in the embodiments as a high-frequency filter. The communication device is a cellular phone, wireless LAN apparatus, wireless transceiver, television tuner, radio tuner, or the like. Referring to FIG. 33, the communication device includes sender circuitry 300A, receiver circuitry 300B, a sender/receiver changeover switch 301 for switching a sender path and a receiver path, a high-frequency filter 302 made up of the microresonator described in the embodiments, and an antenna 303 for transmission and reception.

The sender circuitry 300A includes two digital/analogue converters (DACs) 311I and 311Q and two bandpass filters 312I and 312Q that correspond to data to be transmitted (sender data, hereinafter) of I and Q channels, respectively, a modulator 320, a sender phase-locked loop (PLL) circuit 313, and a power amplifier 314. The modulator 320 includes two buffer amplifiers 321I and 321Q and two mixers 322I and 322Q that correspond to two bandpass filters 312I and 312Q, a phase shifter 323, an adder 324, and a buffer amplifier 325.

The receiver circuitry 300B includes a high-frequency unit 330, a bandpass filter 341, a channel selection PLL circuit 342, an intermediate-frequency circuit 350, a bandpass filter 343, a demodulator 360, an intermediate-frequency PLL circuit 344, and two bandpass filters 345I and 345Q and two analogue/digital converters (ADCs) 346I and 346Q that correspond to received data of I and Q channels, respectively. The high-frequency unit 330 includes a low-noise amplifier 331, buffer amplifiers 332 and 334, and a mixer 333. The intermediate-frequency circuit 350 includes buffer amplifiers 351 and 353, and an auto gain controller (AGC) circuit 352. The demodulator 360 includes a buffer amplifier 361, two mixers 362I and 362Q and two buffer amplifiers 363I and 363Q that correspond to two bandpass filters 345I and 345Q, and a phase shifter 364.

In the communication device, when sender data of I and Q channels is input to the sender circuitry 300A, each sender data is processed through the following procedure. Specifically, the data is converted into analogue signals by the DACs 311I and 311Q. Subsequently, from the analogue signals, signal components in bands other than the bands of sender signals are removed by the bandpass filters 312I and 312Q. The resultant signals are supplied to the modulator 320. In the modulator 320, the signals are supplied via the buffer amplifiers 321I and 321Q to the mixers 322I and 322Q. In the mixers, the signals are combined with frequency signals supplied from the SENDER PLL CIRCUIT 313 and corresponding to the transmission frequency, so as to be modulated. The both combined signals are then added to each other in the adder 324 to thereby be tuned into one sender signal. Prior to this modulation, the phase of the frequency signal to be supplied to the mixer 322I is shifted by 90° in the phase shifter 323, to thereby quadrature-modulate the I-channel signal with respect to the Q-channel signal. Finally, the signal is supplied via the buffer amplifier 325 to the power amplifier 314, followed by being amplified to have a certain transmission power. The signal amplified by the power amplifier 314 is supplied via the sender/receiver changeover switch 301 and the high-frequency filter 302 to the antenna 303, and then is wireless transmitted from the antenna 303. The high-frequency filter 302 functions as a bandpass filter that removes signal components in bands other than frequency bands of sender and receiver signals of the communication device.

When a signal is received by the antenna 303 and then is transmitted via the high-frequency filter 302 and the sender/ receiver changeover switch 301 to the receiver circuitry 300B, the signal is processed through the following procedure. Specifically, in the high-frequency unit 330, the receiver signal is amplified by the low-noise amplifier 331, and then from the amplified signal, signal components in bands other than the receiver frequency band are removed by the bandpass filter 341. The resultant signal is supplied via the buffer amplifier 332 to the mixer 333. Subsequently, the signal is combined with a frequency signal supplied from the channel selection PLL circuit 342, to thereby turn a signal of a certain sender channel to an intermediate-frequency signal. The intermediate-frequency signal is supplied via the buffer amplifier 334 to the intermediate-frequency circuit 350. Subsequently, in the intermediate-frequency circuit 350, the signal is supplied via the buffer amplifier 351 to the bandpass filter 343. In the bandpass filter 343, signal components in bands other than the band of the intermediate-frequency signal are removed from the signal. The resultant signal is turned into an almost constant gain signal by the AGC circuit 352, and then is supplied via the buffer amplifier 353 to the demodulator 360. Subsequently, in the demodulator 360, the signal is supplied via the buffer amplifier 361 to the mixers 362I and 362Q, followed by being combined with frequency signals supplied from the intermediate-frequency PLL circuit 344 so as to be demodulated into signal components of I and Q channels. Prior to this demodulation, the phase of the frequency signal to be supplied to the mixer 362I is shifted by 90° in the phase shifter 364, to thereby demodulate the signal into the signal components of I and Q channels quadrature-modulated with respect to each other. Finally, the signals of I and Q channels are supplied to the bandpass filters 345I and 345Q, respectively, and thus signal components other than the signals of I and Q channels are removed. The resultant signals are supplied to the ADCs 346I and 346Q to thereby be turned into digital data. Thus, received data of I and Q channels is obtained.

Since the communication device includes the microresonator described in the above-described embodiments as the high-frequency filter 302, the frequency characteristic of the microresonator is less susceptible to deterioration due to the influence of mutual interference arising among the resonator elements F, based on the operation described in the embodiments. Thus, the provision of the microresonator can ensure a desired frequency characteristic.

Although the microresonator described in the embodiments is applied to the high-frequency filter 302 in the communication device of FIG. 33, the invention is not limited thereto. For example, the microresonator may be applied to a series of bandpass filters typified by the bandpass filters 312I and 312Q instead of the high-frequency filter 302. A desired frequency characteristic can be ensured also in this case.

Although the microresonators and manufacturing methods thereof have been described above based on the various embodiments, the invention is not limited to the embodiments. The structures of the microresonators and procedures of the manufacturing methods of the microresonators can freely be modified as long as the same advantages as those of the embodiments can be achieved.

In addition, although in the embodiments, the microresonators and manufacturing methods thereof have been described as application to a high-frequency filter, the invention is not limited thereto. The microresonators and manufacturing methods thereof according to the embodiments can also be applied to an electronic device other than a high-frequency filter. Furthermore, although in the embodiments, the microresonators and manufacturing methods thereof have been described as application to an electronic apparatus typified by a communication device such as a cellular phone, the invention is not limited thereto. The microresonators and manufacturing methods thereof according to the embodiments can also be applied to an electronic apparatus other than a communication device. In either case, the same advantages as those of the embodiments can be achieved.

It should be understood by those skilled in the art that various modifications, combinations, sub-combinations and alternations may occur depending on design requirements and other factors insofar as they are within the scope of the appended claims or the equivalents thereof.

What is claimed is:

1. A microresonator including a plurality of resonator elements arranged on a plurality of columns on a substrate, the resonator elements each having an input electrode, an output electrode, and a diaphragm that extends in a certain direction, and each passing a signal of a certain frequency, the plurality of resonator elements comprising:
   a plurality of first resonator elements arranged on first columns that are located on every other column of the plurality of columns, and having a first phase; and
   a plurality of second resonator elements arranged on second columns that are located on every other column, other than the first columns, of the plurality of columns, and having a second phase that is an opposite phase of the first phase.

2. The microresonator according to claim 1, wherein:
   the input electrode and the output electrode are juxtaposed to each other in each resonator element in a manner of extending in a direction that intersects with the direction in which the diaphragm extends; and
   a positional relationship between the juxtaposed input and output electrodes on the first columns is opposite to a positional relationship between the juxtaposed input and output electrodes on the second columns.

3. The microresonator according to claim 1, wherein the plurality of first resonator elements and the plurality of second resonator elements are arranged so that positions of the first resonator elements are offset relative to positions of the second resonator elements in the direction in which the diaphragm extends.

4. The microresonator according to claim 3, wherein the plurality of first resonator elements and the plurality of second resonator elements are arranged in a staggered manner.

5. The microresonator according to claim 1, wherein the plurality of first resonator elements and the plurality of second resonator elements are arranged to be adjacent to each other in a direction perpendicular to the direction in which the diaphragm extends.

6. A method of manufacturing a microresonator including a plurality of resonator elements arranged on a plurality of columns on a substrate, the resonator elements each having an input electrode, an output electrode and a diaphragm that extends in a certain direction, and each passing a signal of a certain frequency, the method including a step of forming the plurality of resonator elements, the step comprising:
   forming a plurality of first resonator elements constituting one part of the plurality of resonator elements so that the first resonator elements are arranged on first columns located on every other column of the plurality of columns, and have a first phase; and
   forming a plurality of second resonator elements constituting the other part of the plurality of resonator elements so that the second resonator elements are arranged on second columns located on every other column, other than the first columns, of the plurality of columns, and have a second phase that is an opposite phase of the first phase.

7. The method of manufacturing a microresonator according to claim 6, wherein:
   the input electrode and the output electrode are formed in each resonator element so that the input and output electrodes are juxtaposed to each other and extend in a direction that intersects with the direction in which the diaphragm extends; and
   a positional relationship between the juxtaposed input and output electrodes on the first columns is opposite to a positional relationship between the juxtaposed input and output electrodes on the second columns.

8. The method of manufacturing a microresonator according to claim 6, wherein the plurality of first resonator elements and the plurality of second resonator elements are formed so that positions of the first resonator elements are offset relative to positions of the second resonator elements in the direction in which the diaphragm extends.

9. The method of manufacturing a microresonator according to claim 8, wherein the plurality of first resonator elements and the plurality of second resonator elements are arranged in a staggered manner.

10. The method of manufacturing a microresonator according to claim 6, wherein the plurality of first resonator elements and the plurality of second resonator elements are formed so that the first and second resonator elements are adjacent to each other in a direction perpendicular to the direction in which the diaphragm extends.

11. The method of manufacturing a microresonator according to claim 6, wherein the step of forming the plurality of resonator elements includes:
   forming the input electrode and the output electrode on the substrate;
   forming a sacrificial film to cover the input electrode and the output electrode;
   forming the diaphragm on the sacrificial film; and
   removing the sacrificial film selectively to thereby form the resonator element having the input electrode, the output electrode, and the diaphragm.

12. An electronic apparatus including a microresonator that has a plurality of resonator elements arranged on a plurality of columns on a substrate, the resonator elements each having an input electrode, an output electrode, and a diaphragm that extends in a certain direction, and each passing a signal of a certain frequency, the plurality of resonator elements comprising:
   a plurality of first resonator elements arranged on first columns that are located on every other column of the plurality of columns, and having a first phase; and
   a plurality of second resonator elements arranged on second columns that are located on every other column, other than the first columns, of the plurality of columns, and having a second phase that is an opposite phase of the first phase.

* * * * *